(12) United States Patent
Takewaki

(10) Patent No.: US 8,779,799 B2
(45) Date of Patent: Jul. 15, 2014

(54) LOGIC CIRCUIT

(75) Inventor: Yoshiya Takewaki, Urasoe (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 157 days.

(21) Appl. No.: 13/467,500

(22) Filed: May 9, 2012

(65) Prior Publication Data

US 2012/0293209 A1 Nov. 22, 2012

(30) Foreign Application Priority Data

May 19, 2011 (JP) ................................. 2011-112804

(51) Int. Cl.
*H03K 19/20* (2006.01)
*G11C 11/34* (2006.01)

(52) U.S. Cl.
USPC ....... 326/106; 326/103; 326/104; 365/185.01

(58) Field of Classification Search
USPC ........................................................ 326/103
See application file for complete search history.

(56) References Cited

U.S. PATENT DOCUMENTS

| | | | |
|---|---|---|---|
| 4,870,302 A | 9/1989 | Freeman | |
| 5,164,612 A | 11/1992 | Kaplinsky | |
| 5,381,058 A | 1/1995 | Britton et al. | |
| 5,545,579 A | 8/1996 | Liang et al. | |
| 5,635,859 A * | 6/1997 | Yokota et al. | 326/67 |
| 5,677,691 A | 10/1997 | Hosticka et al. | |
| 5,731,856 A | 3/1998 | Kim et al. | |
| 5,744,864 A | 4/1998 | Cillessen et al. | |
| 5,796,128 A | 8/1998 | Tran et al. | |
| 6,057,707 A | 5/2000 | Schleicher et al. | |
| 6,118,300 A | 9/2000 | Wittig et al. | |

(Continued)

FOREIGN PATENT DOCUMENTS

| EP | 1737044 A | 12/2006 |
|---|---|---|
| EP | 1755223 A | 2/2007 |

(Continued)

OTHER PUBLICATIONS

Jeon.S et al., "180nm Gate Length Amorphous InGaZnO Thin Film Transistor for High Density Image Sensor Applications,", IEDM 10: Technical Digest of International Electron Devices Meeting, Dec. 6, 2010, pp. 504-507. Eng.

(Continued)

*Primary Examiner* — Alexander H Taningco
*Assistant Examiner* — Nelson Correa
(74) *Attorney, Agent, or Firm* — Eric J. Robinson; Robinson Intellectual Property Law Office, P.C.

(57) ABSTRACT

A logic circuit is provided which can hold a switching state of the logic circuit even when a power supply potential is not supplied, has short start-up time of a logic block after the power is supplied, can operate with low power consumption, and can easily switch between a NAND circuit and a NOR circuit. Switching between a NAND circuit and a NOR circuit is achieved by switching a charge holding state at a node through a transistor including an oxide semiconductor. With the use of an oxide semiconductor material which is a wide bandgap semiconductor for the transistor, the off-state current of the transistor can be sufficiently reduced; thus, the state of charge held at the node can be non-volatile.

15 Claims, 23 Drawing Sheets

(56) References Cited

U.S. PATENT DOCUMENTS

| | | | |
|---|---|---|---|
| 6,127,702 A | 10/2000 | Yamazaki et al. | |
| 6,130,553 A | 10/2000 | Nakaya | |
| 6,172,521 B1 | 1/2001 | Motomura | |
| 6,294,274 B1 | 9/2001 | Kawazoe et al. | |
| 6,363,004 B1 | 3/2002 | Kang et al. | |
| 6,384,628 B1 | 5/2002 | Lacey et al. | |
| 6,563,174 B2 | 5/2003 | Kawasaki et al. | |
| 6,727,522 B1 | 4/2004 | Kawasaki et al. | |
| 6,856,173 B1 | 2/2005 | Chun | |
| 6,856,542 B2* | 2/2005 | Roy et al. | 365/185.08 |
| 6,924,663 B2 | 8/2005 | Masui et al. | |
| 7,030,651 B2 | 4/2006 | Madurawe | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,129,745 B2 | 10/2006 | Lewis et al. | |
| 7,199,618 B2 | 4/2007 | Gliese et al. | |
| 7,211,825 B2 | 5/2007 | Shih et al | |
| 7,242,614 B2* | 7/2007 | Diorio et al. | 365/185.08 |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,327,169 B2* | 2/2008 | Osame et al. | 345/104 |
| 7,348,827 B2 | 3/2008 | Rahim et al. | |
| 7,385,224 B2 | 6/2008 | Ishii et al. | |
| 7,400,167 B2 | 7/2008 | Lewis et al. | |
| 7,402,506 B2 | 7/2008 | Levy et al. | |
| 7,405,589 B2 | 7/2008 | Lewis et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,525,361 B2* | 4/2009 | Kim | 327/208 |
| 7,573,317 B2 | 8/2009 | Lewis et al. | |
| 7,674,650 B2 | 3/2010 | Akimoto et al. | |
| 7,732,819 B2 | 6/2010 | Akimoto et al. | |
| 7,791,074 B2 | 9/2010 | Iwasaki | |
| 7,795,923 B1* | 9/2010 | Wu | 326/113 |
| 8,026,739 B2 | 9/2011 | Sullam et al. | |
| 8,103,975 B2 | 1/2012 | Lewis et al. | |
| 8,138,786 B2 | 3/2012 | Lewis et al. | |
| 8,294,489 B2 | 10/2012 | Tanamoto et al. | |
| 8,451,651 B2* | 5/2013 | Matsuzaki et al. | 365/149 |
| 8,547,753 B2 | 10/2013 | Takemura et al. | |
| 2001/0044923 A1* | 11/2001 | Kobayashi et al. | 716/1 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0080800 A1 | 5/2003 | Kuttner | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1* | 10/2006 | Kimura | 315/169.3 |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0040576 A1 | 2/2007 | Lewis et al. | |
| 2007/0040577 A1 | 2/2007 | Lewis et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0164936 A1 | 7/2008 | Rahim et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0263481 A1 | 10/2008 | Lewis et al. | |
| 2008/0263490 A1 | 10/2008 | Lewis et al. | |
| 2008/0296568 A1 | 12/2008 | Ryu et al. | |
| 2008/0308805 A1 | 12/2008 | Akimoto et al. | |
| 2009/0045397 A1 | 2/2009 | Iwasaki | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0167352 A1 | 7/2009 | Norman | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0084648 A1 | 4/2010 | Watanabe | |
| 2010/0092800 A1 | 4/2010 | Itagaki et al. | |
| 2010/0109002 A1 | 5/2010 | Itagaki et al. | |
| 2010/0133589 A1 | 6/2010 | Aruga et al. | |
| 2010/0148171 A1 | 6/2010 | Hayashi et al. | |
| 2010/0276689 A1 | 11/2010 | Iwasaki | |
| 2010/0279462 A1 | 11/2010 | Iwasaki | |
| 2011/0175646 A1 | 7/2011 | Takemura et al. | |
| 2012/0089958 A1 | 4/2012 | Lewis et al. | |
| 2012/0212995 A1 | 8/2012 | Kurokawa | |
| 2012/0268164 A1 | 10/2012 | Kobayashi et al. | |
| 2012/0293202 A1 | 11/2012 | Nishijima et al. | |
| 2012/0293203 A1 | 11/2012 | Ohmaru et al. | |
| 2012/0293206 A1 | 11/2012 | Yoneda et al. | |
| 2013/0147518 A1 | 6/2013 | Shionoiri et al. | |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 637265818 A | 11/1988 |

(56) References Cited

FOREIGN PATENT DOCUMENTS

| | | |
|---|---|---|
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-015060 | 1/2004 |
| JP | 2004-103957 A | 4/2004 |
| JP | 2004-273614 A | 9/2004 |
| JP | 2004-273732 A | 9/2004 |
| JP | 2004-312701 | 11/2004 |
| WO | WO-2004/114391 | 12/2004 |
| WO | WO-2005/116878 | 12/2005 |
| WO | WO-2007/029844 | 3/2007 |
| WO | WO-2008/126879 | 10/2008 |

OTHER PUBLICATIONS

Ishii.T et al., "A Poly-Silicon TFT With a Sub-5-nm Thick Channel for Low-Power Gain Cell Memory in Mobile Applications,", IEEE Transactions on Electron Devices, Nov. 1, 2004, vol. 51, No. 11, pp. 1805-1810.

Choi.D et al., "New Non-Volatile Memory Structures for FPGA Architectures,", IEEE Transactions on Very Large Scale Integration (VLSI) Systems, Jul. 1, 2008, vol. 16, No. 7, pp. 874-881, IEEE.

Kim.W et al., "An Experimental High-Density DRAM Cell with a Built-in Gain Stage,", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs,", IEDM 92: Technical Digest of International Electron Devices Meeting, Dec. 13, 1992, pp. 1006-1008.

Shukuri.S et al., "A Semi-Static Complementary Gain Cell Technology for Sub-1 V Supply DRAM's,", IEEE Transactions on Electron Devices, Jun. 1, 1994, vol. 41, No. 6, pp. 926-931.

Song.I et al., "Short Channel Characteristics of Gallium-Indium-Zinc-Oxide Thin Film Transistors for Three-Dimensional Stacking Memory,", IEEE Electron Device Letters, Jun. 1, 2008, vol. 29, No. 6, pp. 549-552.

Fortunato.E et al., "Wide-Bandgap High-Mobility ZnO Thin-Film Transistors Produced At Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04: SID International Symposium Digest of Technical Papers.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08: Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08: SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3-Ga2ZnO4-ZnO system at 1350°C,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T at al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K at al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous Gizo (Ga2O3-In2O3-ZnO) TFT,", SID Digest '08: SID International Symposium Digest of Technical Papers, May 20, 2008, vol. 39, pp. 633-636.

Lee.J at al., "World'S Largest (15-Inch) XGA AMLCD Panel Using Igzo Oxide TFT,", SID Digest '08: SID International Symposium Digest of Technical Papers, May 20, 2008, vol. 39, pp. 625-628.

Nowatari.H at al., "60.2: Intermediate Connector With Suppressed Voltage Loss for White Tandem OLEDS,", SID Digest '09: SID International Symposium Digest of Technical Papers, May 31, 2009, vol. 40, pp. 899-902.

Kanno.H at al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02: Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08: SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

(56) References Cited

OTHER PUBLICATIONS

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back Plane,", SID Digest '09: SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09: SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09: SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTs,", IDW '09: Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown Zno TFT,", IMID '07 Digest, 2007, pp. 1249-1252.

Godo.H et al., "Temperature Dependence of Characteristics and Electronic Structure For Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide.TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07: SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09: SID International Symposium Digest of Technical Papers, May 31, 2009, pp. 1110-1112.

Ohara.H et al., "21.3:4.0 In. QVGA AMOLED Display Using In-Ga-Zn-Oxide TFTs With a Novel Passivation Layer,", SID Digest '09: SID International Symposium Digest of Technical Papers, May 31, 2009, pp. 284-287.

Miyasaka.M, "Suftla Flexible Microelectronics on Their Way to Business,", SID Digest '07: SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09: SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09: SID International Symposium Digest of Technical Papers, May 31, 2009, pp. 395-398.

Lee.H et al., "Current Status of, Challenges to, and Perspective View of AM-OLED,", IDW'06: Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07: SID International Symposium Digest of Technical Papers, 2007, vol. 38, pp. 1737-1740.

Nakamura.M, "Synthesis of Homologous Compound with New Long-Period Structure,", Nirim Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel, YBFE204, and YB2FE307 Types of Structures for Compounds in the IN2O3 and SC2O3-A2O3-BO Systems [A; Fe, Ga, or AL; B: Mg, Mn, Fe, Ni, Cu,or Zn] At Temperatures Over 1000°C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08: SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08: SID International Symposium Digest of Technical Papers, 2008, vol. 39, pp. 1277-1280.

Janotti.A et al., "Oxygen Vacancies In ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08: Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

(56) References Cited

OTHER PUBLICATIONS

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving The Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

\* cited by examiner

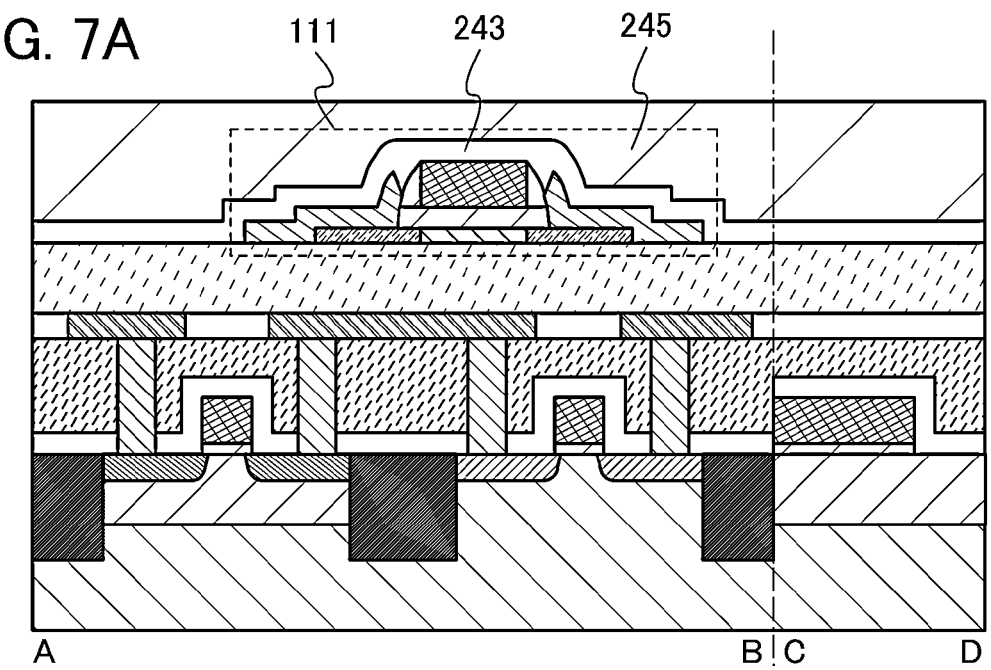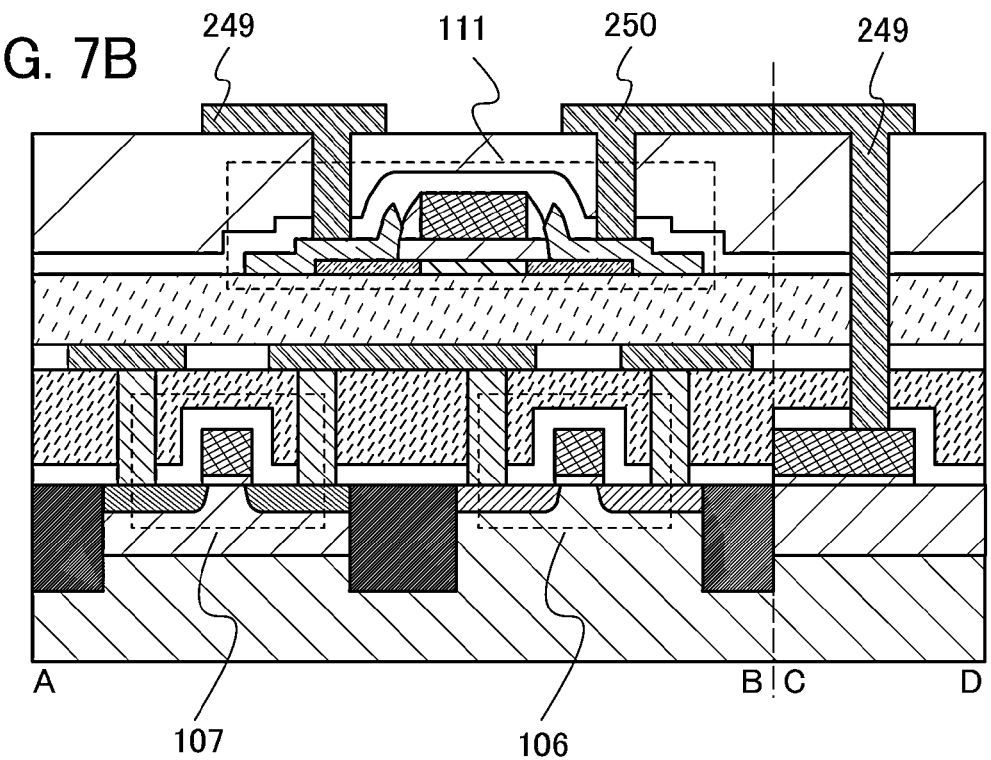

c-axis direction

Electric charge 0

Electric charge +1

Electric charge 0 a-b plane

Electric charge −1

Electric charge 0

● In
◐ Sn
◔ Zn
● O

- In
- Ga
- Zn
- O

LOGIC CIRCUIT

BACKGROUND OF THE INVENTION

1. Field of the Invention

The present invention relates to a logic circuit and a semiconductor device including the logic circuit. Further, the present invention relates to an electronic device including the semiconductor device.

In this specification, a semiconductor device generally means a device which can function by utilizing semiconductor characteristics, and an electro-optical device, a light-emitting display device, a large scale integrated circuit, and an electronic device are all semiconductor devices.

2. Description of the Related Art

In general, a circuit configuration of a semiconductor integrated circuit typified by a large scale integration (LSI) circuit is fixed at the time of manufacture and cannot be changed after the manufacture. In contrast, a semiconductor integrated circuit called a programmable logic device (PLD) has a structure in which unit logic blocks each including a plurality of logic circuits are electrically connected to each other through wirings. In the programmable logic device, a circuit configuration of each logic block can be controlled by an electric signal.

Accordingly, the design of the programmable logic device can be changed even after the manufacture. Thus, time and cost required for designing and developing a semiconductor integrated circuit can be greatly reduced with the use of the programmable logic device.

Programmable logic devices include a complex PLD (CPLD) and a field programmable gate array (FPGA). In either of the programmable logic devices, a circuit configuration of each logic block is controlled by a programmable switch in the logic block, which performs switching in accordance with data (configuration data) stored in a memory portion. In other words, data is programmed into each programmable switch, whereby a circuit configuration of a programmable logic device can be changed.

A volatile memory such as a static random access memory (SRAM) is mainly used in the above-described memory portion. On the other hand, as disclosed in Patent Document 1, a non-volatile memory including a floating gate transistor, such as a flash memory, is included in the memory portion in some cases (see Patent Document 1).

REFERENCE

[Patent Document 1] Japanese Published Patent Application No. 2004-15060

As described above, in a programmable logic device, a circuit configuration of each logic block is controlled by a programmable switch which performs switching in accordance with data stored in a memory portion. In the case where a volatile memory such as SRAM is included in the memory portion of the programmable switch, configuration data stored in the memory portion is lost when the supply of power supply voltage is stopped. Accordingly, in the programmable logic device including the volatile memory in the memory portion of the programmable switch, configuration data needs to be written to the volatile memory every time the power is supplied. Therefore, there is a long delay time from the start of supply of power to operation of the logic block.

In the case where a floating gate transistor is used in a memory portion of a programmable switch of a programmable logic device so that the memory portion becomes non-volatile, configuration data can be held even when power supply voltage is not supplied. However, a high potential needs to be applied because electrons need to be injected into a floating gate in data writing; accordingly, it takes a long time to write data. Therefore, there is a problem of increased power consumption. Moreover, there is a problem in that a gate insulating layer of the floating gate deteriorates because of tunneling current generated in the data writing.

SUMMARY OF THE INVENTION

In view of the above problems, it is an object of the present invention to provide a logic circuit which can hold a switching state of the logic circuit even when a power supply potential is not supplied, has short start-up time of a logic block after the power is supplied, can operate with low power consumption, and can easily switch between a NAND circuit and a NOR circuit.

In one embodiment of the present invention, a transistor with sufficiently small off-state current is used for switching between a NAND circuit and a NOR circuit. The transistor can be formed using, for example, an oxide semiconductor which is a wide bandgap semiconductor as a material which allows a sufficient reduction in off-state current of the transistor. When such a semiconductor material which allows a sufficient reduction in off-state current of the transistor is used, a switching state of the logic circuit can be held even when a power supply potential is not supplied.

The off-state current per micrometer of channel width of the transistor is $1\times10^{-18}$ A or less, preferably $1\times10^{-21}$ A or less, more preferably $1\times10^{-24}$ A or less. With the use of such a transistor, a memory cell with excellent data holding characteristics and low power consumption can be manufactured.

One embodiment of the present invention is a logic circuit which includes first to fourth transistors connected in series, fifth to eighth transistors connected in series, a ninth transistor and a tenth transistor with gates connected to each other, and an eleventh transistor with one of a source and a drain connected to the gates of the ninth transistor and the tenth transistor. One of a source and a drain of the first transistor and one of a source and a drain of the fifth transistor are connected to a high potential power supply line. One of a source and a drain of the fourth transistor and one of a source and a drain of the eighth transistor are grounded or connected to a low potential power supply line. A gate of the first transistor, a gate of the third transistor, and a gate of the eighth transistor are connected to a first signal line. A gate of the second transistor, a gate of the fourth transistor, and a gate of the fifth transistor are connected to a second signal line. A gate of the sixth transistor, a gate of the seventh transistor, the gate of the ninth transistor, and the gate of the tenth transistor are connected to the one of the source and the drain of the eleventh transistor, where a node is formed. The other of the source and the drain of the eleventh transistor is connected to a third signal line. A gate of the eleventh transistor is connected to a fifth signal line. One of a source and a drain of the ninth transistor is connected to the other of the source and the drain of the first transistor and one of a source and a drain of the second transistor. The other of the source and the drain of the ninth transistor is connected to the other of the source and the drain of the fifth transistor and one of a source and a drain of the sixth transistor. One of a source and a drain of the tenth transistor is connected to one of a source and a drain of the third transistor and the other of the source and the drain of the fourth transistor. The other of the source and the drain of the tenth transistor is connected to one of a source and a drain of the seventh transistor and the other of the source and the drain of the eighth transistor. The other of the source and the drain of the second transistor, the other of the source and the drain of the third transistor, the other of the source and the drain of the sixth transistor, and the other of the source and the drain of the seventh transistor are connected to a fourth signal line. The eleventh transistor includes an oxide semiconductor.

In one embodiment of the present invention, the logic circuit includes a capacitor connected to the node.

In one embodiment of the present invention, the logic circuit is capable of switching to a NOR circuit or a NAND circuit by switching a charge holding state at the node.

In one embodiment of the present invention, the first transistor, the second transistor, the fifth transistor, the sixth transistor, and the ninth transistor are p-channel transistors, and the third transistor, the fourth transistor, the seventh transistor, the eighth transistor, the tenth transistor, and the eleventh transistor are n-channel transistors. For example, in the case where the first to tenth transistors each have a channel region formed using silicon and the eleventh transistor has a channel region formed using an oxide semiconductor, the eleventh transistor can be stacked over the first to tenth transistors, which can lead to a reduction in the area occupied by the transistors in a circuit.

In one embodiment of the present invention, the above oxide semiconductor contains at least one element selected from In, Ga, Sn, and Zn. With the use of such an oxide semiconductor for a channel region of a transistor, the amount of off-state current of the transistor can be small. Thus, when the transistor including an oxide semiconductor is applied to a logic circuit, power consumption can be reduced.

According to one embodiment of the present invention, it is possible to provide a logic circuit which can hold a switching state of the logic circuit even when a power supply potential is not supplied, has short start-up time of a logic block after the power is supplied, can operate with low power consumption, and can easily switch between a NAND circuit and a NOR circuit.

BRIEF DESCRIPTION OF THE DRAWINGS

FIGS. 7A and 7B illustrate steps of manufacturing a transistor in a logic circuit according to an embodiment of the present invention.

DETAILED DESCRIPTION OF THE INVENTION

Figure 1:
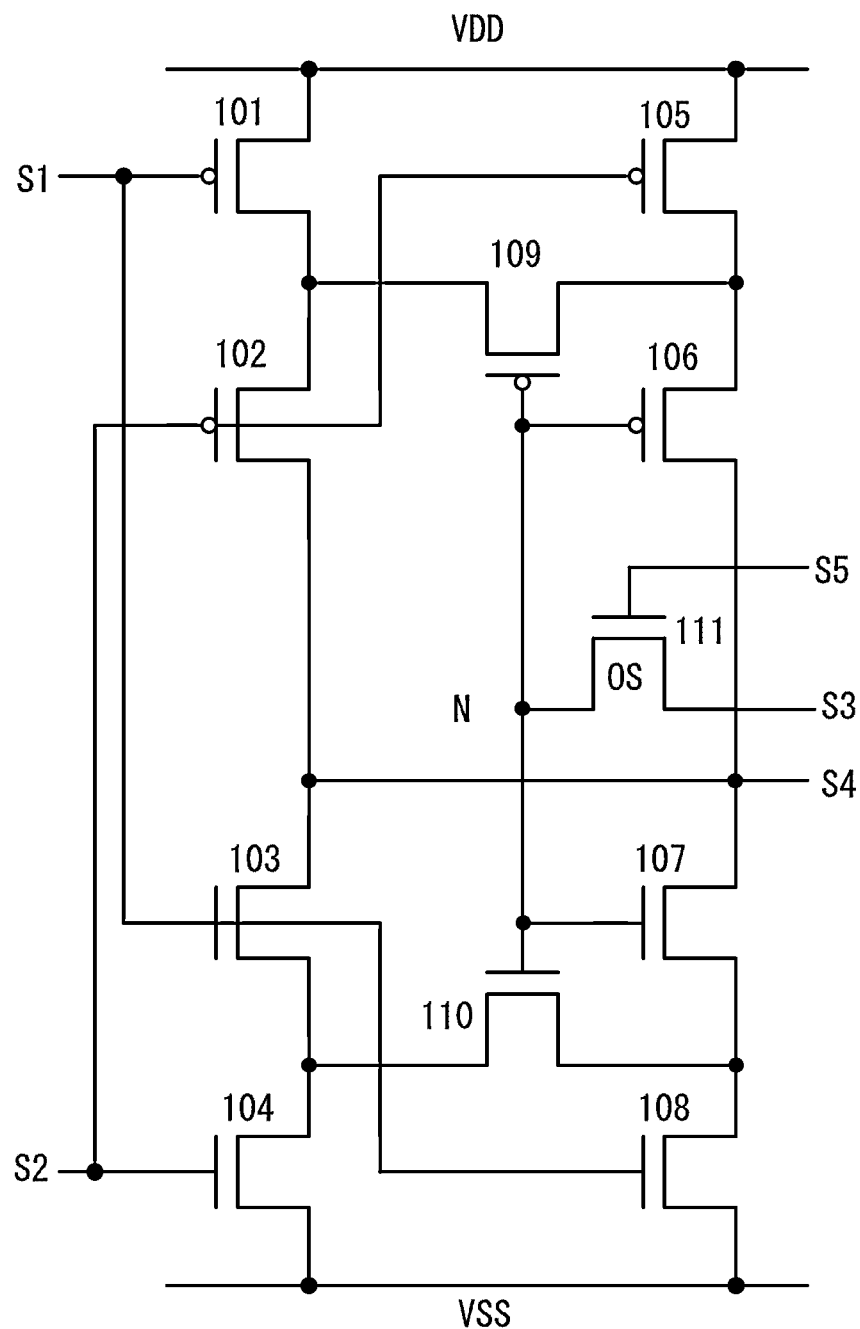
FIG. 1 is a circuit diagram illustrating a logic circuit according to an embodiment of the invention.

Embodiments of the present invention will be described in detail with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments. Note that in the structures of the present invention described below, the same portions or portions having similar functions are denoted by the same reference numerals in different drawings, and description of such portions is not repeated.

Note that in each drawing described in this specification, the size, the film thickness, or the region of each component may be exaggerated for clarity. Therefore, embodiments of the present invention are not limited to such scales.

Furthermore, terms such as "first", "second", and "third" in this specification are used in order to avoid confusion among components, and the terms do not limit the components numerically. Therefore, for example, the term "first" can be replaced with the term "second", "third", or the like as appropriate.

In addition, in this specification, when one of a source and a drain of a transistor is called a drain, the other is called a source. That is, they are not distinguished depending on the potential level. Therefore, a region called a source in this specification can alternatively be referred to as a drain.

Note that the term "electrically connected" in this specification includes the case where components are connected through an "object having any electric function". There is no particular limitation on an object having any electric function as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

In this specification, even when a circuit diagram shows independent components as if they are electrically connected to each other, there is actually a case where one conductive film has functions of a plurality of components such as a case where part of a wiring also functions as an electrode. The expression "electrically connected" in this specification also includes such a case where one conductive film has functions of a plurality of components.

Embodiment 1

In this embodiment, a logic circuit capable of switching between a NAND circuit and a NOR circuit according to one embodiment of the present invention will be described with reference to FIG. 1.

In the logic circuit illustrated in FIG. 1, a first transistor 101, a second transistor 102, a third transistor 103, and a fourth transistor 104 are connected in series. A fifth transistor 105, a sixth transistor 106, a seventh transistor 107, and an eighth transistor 108 are connected in series. One of a source and a drain of the first transistor 101 and one of a source and a drain of the fifth transistor 105 are connected to a high potential power supply line VDD. One of a source and a drain of the fourth transistor 104 and one of a source and a drain of the eighth transistor 108 are connected to a low potential power supply line VSS. A gate of the first transistor 101, a gate of the third transistor 103, and a gate of the eighth transistor 108 are connected to a first signal line S1. A gate of the second transistor 102, a gate of the fourth transistor 104, and a gate of the fifth transistor 105 are connected to a second signal line S2. A gate of the sixth transistor 106, a gate of the seventh transistor 107, a gate of the ninth transistor 109, and a gate of the tenth transistor 110 are connected to one of a source and a drain of the eleventh transistor 111, where a node N is formed. The other of the source and the drain of the eleventh transistor 111 is connected to a third signal line S3. A gate of the eleventh transistor 111 is connected to a fifth signal line S5. One of a source and a drain of the ninth transistor 109 is connected to the other of the source and the drain of the first transistor 101 and one of a source and a drain of the second transistor 102. The other of the source and the drain of the ninth transistor 109 is connected to the other of the source and the drain of the fifth transistor 105 and one of a source and a drain of the sixth transistor 106. One of a source and a drain of the tenth transistor 110 is connected to one of a source and a drain of the third transistor 103 and the other of the source and the drain of the fourth transistor 104. The other of the source and the drain of the tenth transistor 110 is connected to one of a source and a drain of the seventh transistor 107 and the other of the source and the drain of the eighth transistor 108. The other of the source and the drain of the second transistor 102, the other of the source and the drain of the third transistor 103, the other of the source and the drain of the sixth transistor 106, and the other of the source and the drain of the seventh transistor 107 are connected to a fourth signal line S4.

In the logic circuit illustrated in FIG. 1, the first transistor 101, the second transistor 102, the fifth transistor 105, the sixth transistor 106, and the ninth transistor 109 are p-channel transistors, and the third transistor 103, the fourth transistor 104, the seventh transistor 107, the eighth transistor 108, the tenth transistor 110, and the eleventh transistor 111 are n-channel transistors.

The eleventh transistor 111 includes an oxide semiconductor.

A logic circuit can be formed which is capable of switching to a NAND circuit or a NOR circuit by switching a charge holding state at the node N in such a circuit configuration as in FIG. 1.

The switching of the charge holding state at the node N can be controlled by turning the eleventh transistor 111 on or off. Charge can be held at the node N in the following manner: after the eleventh transistor 111 is turned on by setting the fifth signal line S5 at a high (H) potential, a potential is input through the third signal line S3, and then, the eleventh transistor 111 is turned off by setting the fifth signal line S5 to a low (L) potential.

The charge held at the node N can be released in the following manner: the eleventh transistor 111 is turned on by setting the fifth signal line S5 at the H potential, and the third signal line S3 is grounded.

Furthermore, the potential input through the signal line S3 is a potential at which the seventh transistor 107 and the tenth transistor 110 are turned on, and the sixth transistor 106 and the ninth transistor 109 are turned off. Accordingly, when charge is held at the node N, the seventh transistor 107 and the tenth transistor 110 are turned on, and the sixth transistor 106 and the ninth transistor 109 are turned off. In a state where charge is not held at the node N (in a grounded state), the seventh transistor 107 and the tenth transistor 110 are turned off and the sixth transistor 106 and the ninth transistor 109 are turned on.

Next, the switching of the logic circuit illustrated in FIG. 1 to a NAND circuit or a NOR circuit depending on the charge holding state at the node N will be described. Note that a transistor in an off state (a non-conductive state) is indicated with a cross mark in the diagram. In addition, a transistor including an oxide semiconductor is denoted by "OS" in the diagram.

When charge is held at the node N, the seventh transistor 107 and the tenth transistor 110 are turned on, and the sixth transistor 106 and the ninth transistor 109 are turned off. The circuit in such a state where charge is held at the node N functions as a NOR circuit. An operation of the NOR circuit will be described with reference to FIG. 2.

Figure 2:
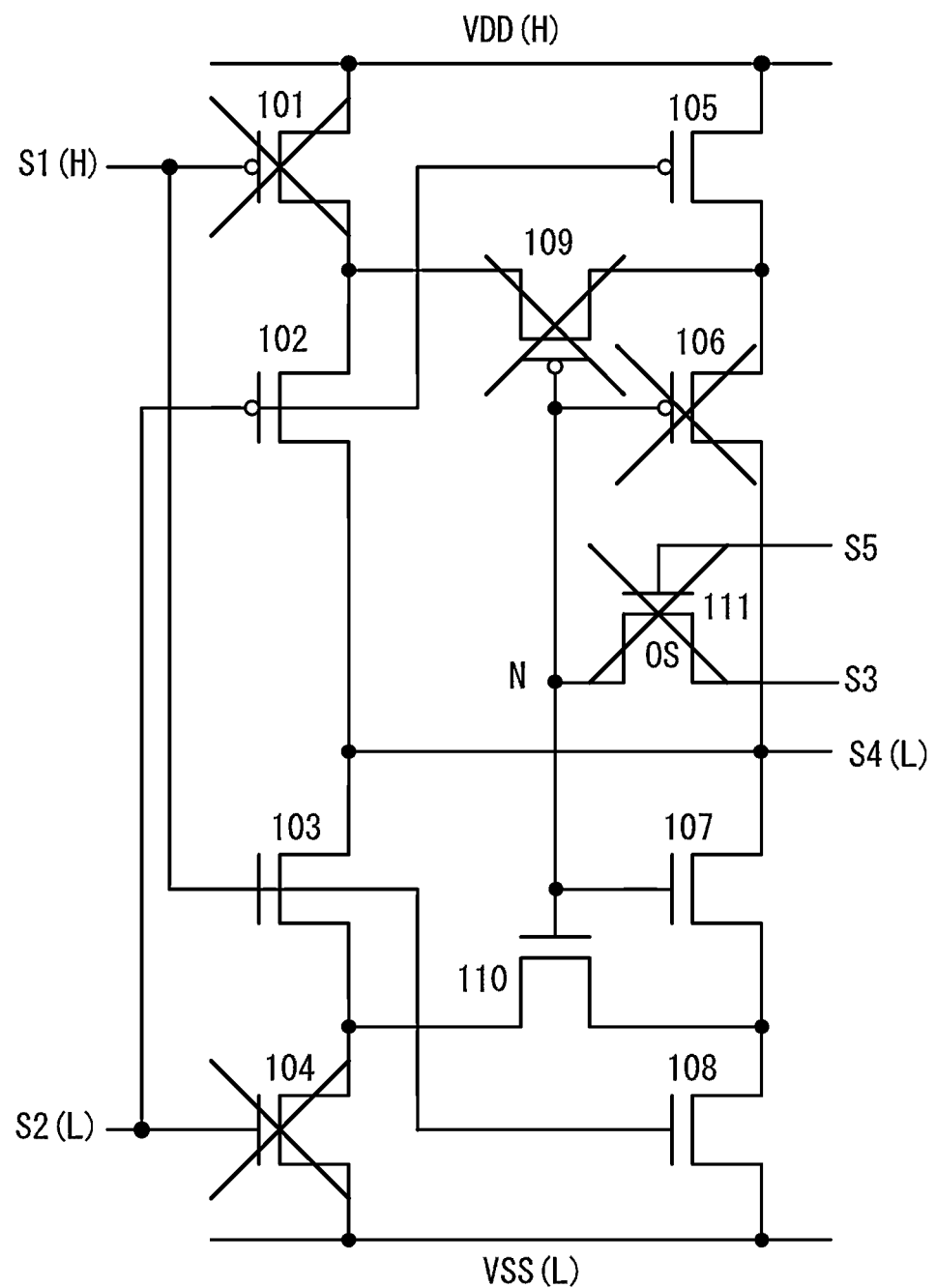
FIG. 2 is a circuit diagram illustrating a logic circuit according to an embodiment of the invention.

FIG. 2 illustrates an operation of the logic circuit in the case where an H potential is input to the first signal line S1 and an L potential is input to the second signal line S2, for example. As illustrated in FIG. 2, the second transistor 102, the third transistor 103, the fifth transistor 105, the seventh transistor 107, the eighth transistor 108, and the tenth transistor 110 are turned on (in a conductive state), and the first transistor 101, the fourth transistor 104, the sixth transistor 106, the ninth transistor 109, and the eleventh transistor 111 are turned off (in a non-conductive state). Accordingly, an L signal input to the low potential power supply line VSS is output to the fourth signal line S4 as an L signal.

Table 1 is a truth table of signals which are output to the signal line S4 when the H potential or the L potential is input to the signal line S1 and the signal line S2 as described above in the NOR circuit illustrated in FIG. 2.

TABLE 1

| NOR circuit | | |
|---|---|---|
| S1 | S2 | S4 |
| L | L | H |
| L | H | L |
| H | L | L |
| H | H | L |

As shown in Table 1, when charge is held at the node N, the logic circuit in this embodiment can function as a NOR circuit.

Next, in the state where charge is not held at the node N, the seventh transistor 107 and the tenth transistor 110 are turned off, and the sixth transistor 106 and the ninth transistor 109 are turned on. The circuit in such a state where charge is not held at the node N functions as a NAND circuit. An operation of the NAND circuit will be described with reference to FIG. 3.

Figure 3:
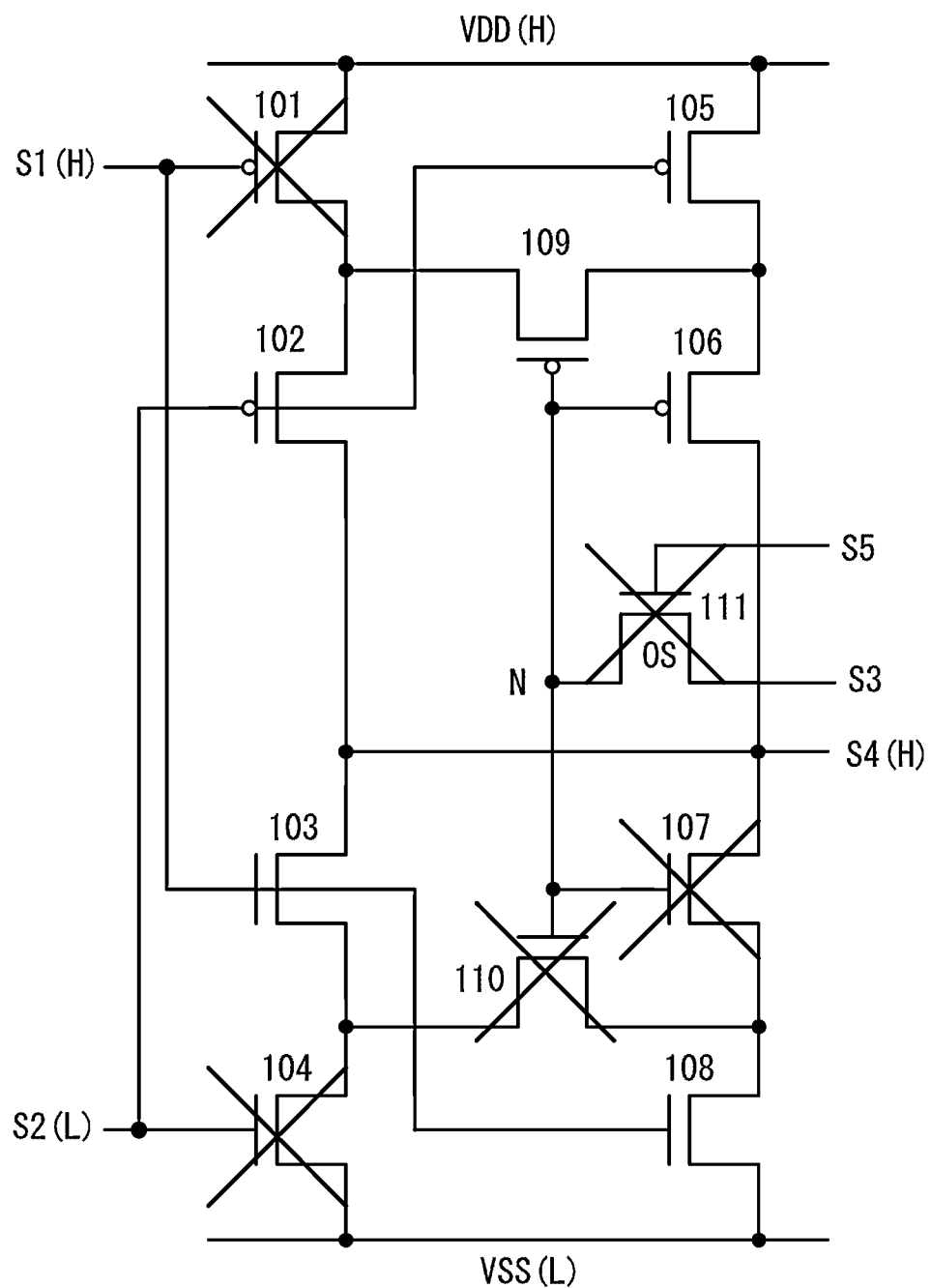
FIG. 3 is a circuit diagram illustrating a logic circuit according to an embodiment of the invention.

FIG. 3 illustrates an operation of the logic circuit in the case where an H potential is input to the first signal line S1 and an L potential is input to the second signal line S2, for example. As illustrated in FIG. 3, the second transistor 102, the third transistor 103, the fifth transistor 105, the sixth transistor 106, the eighth transistor 108, and the ninth transistor 109 are turned on (in a conductive state), and the first transistor 101, the fourth transistor 104, the seventh transistor 107, the tenth transistor 110, and the eleventh transistor 111 are turned off (in a non-conductive state). Accordingly, an H signal input to the high potential power supply line VDD is output to the fourth signal line S4 as an H signal.

Table 2 is a truth table of signals which are output to the signal line S4 when the H potential or the L potential is input to the signal line S1 and the signal line S2 as described above in the NAND circuit illustrated in FIG. 3.

TABLE 2

NAND circuit

| S1 | S2 | S4 |
|---|---|---|
| L | L | H |
| L | H | H |
| H | L | H |
| H | H | L |

As shown in Table 2, when charge is not held at the node N, the logic circuit in this embodiment can function as a NAND circuit.

Thus, a transistor connected to the node N for switching between the NOR circuit and the NAND circuit includes a wide bandgap semiconductor such as an oxide semiconductor, which allows a sufficient reduction in off-state current of the transistor, whereby the charge held at the node N can be held for a long time even when a power supply potential is not supplied, and a switching state of the logic circuit can be kept. Accordingly, even when a power supply potential is not supplied to the logic circuit by a driving method (normally-off driving method) in which supply of power supply voltage to the entire semiconductor device or part thereof is temporarily stopped and a power supply voltage is supplied, when needed, to only a circuit block which requires power, a switching state of the logic circuit can be held. Thus, by the normally-off driving method, injection (writing) of charge to the node N after the power is supplied can be omitted, so that start-up time of the logic circuit can be short. Accordingly, a reduction in power consumption by the normally-off driving method can be achieved by using the logic circuit in this embodiment.

Further, a potential necessary for switching the logic circuit is supplied to the node N through the eleventh transistor 111, whereby the logic circuit can be switched. As compared to the case where a floating gate is used for a memory portion of a programmable switch and configuration data is written by injection of electrons, a potential and time required for writing data can be greatly reduced. Moreover, a problem in that a gate insulating layer of a floating gate deteriorates because of tunneling current generated in the injection of electrons does not occur; accordingly, the number of data rewrite cycles can be increased.

In a general programmable logic device, a circuit configuration of a logic block is changed by switching of a programmable switch in a state where a semiconductor device including the programmable logic device is idle. This is called "configuration". In contrast, configuration performed in a state where the semiconductor device is operating is called "dynamic configuration". As described above, the programmable switch of this embodiment can write configuration data at high speed; accordingly, the dynamic configuration can be easily performed.

With the circuit configuration described above in this embodiment, it is possible to provide a logic circuit which can hold a switching state of the logic circuit even when a power supply potential is not supplied, has short start-up time of a logic block after the power is supplied, can operate with low power consumption, and can easily switch between a NAND circuit and a NOR circuit.

This embodiment can be combined with any of the other embodiments as appropriate.

Embodiment 2

In this embodiment, a method for manufacturing the transistors of the logic circuit in Embodiment 1 will be described with reference to FIGS. 4A to 4D, FIGS. 5A and 5B, FIGS. 6A to 6C, and FIGS. 7A and 7B. A method for manufacturing the transistor 111, the transistor 107, and the transistor 106 of the logic circuit illustrated in FIG. 1 will be described as an example. Note that in FIGS. 4A to 4D, FIGS. 5A and 5B, FIGS. 6A to 6C, and FIGS. 7A and 7B, a cross-sectional view taken along line A-B corresponds to a cross-sectional view of a region where the transistor 111 including an oxide semiconductor film, the n-channel transistor 107, and the p-channel transistor 106 are formed and where the transistor 111 is stacked over the n-channel transistor 107 and the p-channel transistor 106, and a cross-sectional view taken along line C-D corresponds to a cross-sectional view of the node N at which the one of the source electrode and the drain electrode of the transistor 111 including an oxide semiconductor film is connected to the gate electrode of the n-channel transistor 107. Note that although not directly illustrated in this embodiment, as illustrated in FIG. 1, the gate electrode of the p-channel transistor 106 is also electrically connected to the node N.

Figure 4A:
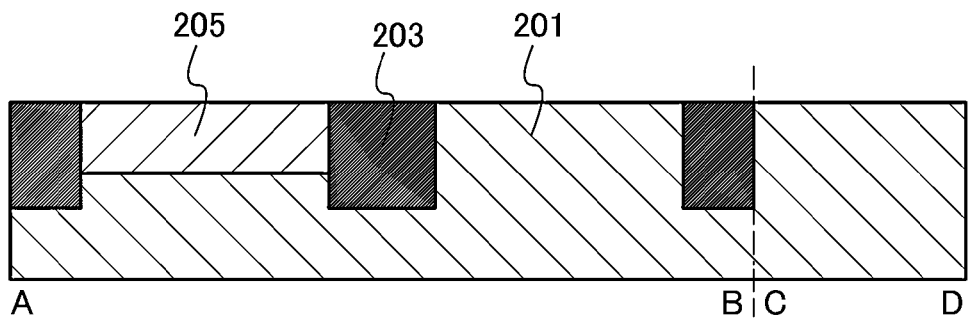
FIGS. 4A to 4D illustrate steps of manufacturing a transistor in a logic circuit according to an embodiment of the present invention.

First, as illustrated in FIG. 4A, an element isolation region 203 is formed in an n-type semiconductor substrate 201, and then a p-well region 205 is formed in part of the n-type semiconductor substrate 201.

As the n-type semiconductor substrate 201, a single crystal silicon substrate (a silicon wafer) having n-type conductivity, or a compound semiconductor substrate (e.g., a SiC substrate, a sapphire substrate, or a GaN substrate) can be used.

Instead of the n-type semiconductor substrate 201, the following substrate may be used as a silicon on insulator (SOI) substrate: a so-called separation by implanted oxygen (SIMOX) substrate which is formed in such a manner that after an oxygen ion is implanted into a mirror-polished wafer, an oxide layer is formed at a certain depth from the surface and defects generated in a surface layer are eliminated by high temperature heating; or an SOI substrate formed by a Smart-Cut method in which a semiconductor substrate is cleaved by utilizing growth of a minute void formed by implantation of a hydrogen ion, by heat treatment, or the like.

The element isolation region 203 is formed by a local oxidation of silicon (LOCOS) method, a shallow trench isolation (STI) method, or the like.

An impurity element imparting p-type conductivity, such as boron, is added to the p-well region 205 at a concentration of approximately $5\times10^{15}$ cm$^{-3}$ to $1\times10^{16}$ cm$^{-3}$. The p-well region 205 is formed in such a manner that a mask is formed over part of the semiconductor substrate 201, and an impurity element imparting p-type conductivity, such as boron, is added to part of the semiconductor substrate 201.

Note that although the n-type semiconductor substrate is used here, a p-type semiconductor substrate may be used and an n-well region to which an impurity element imparting n-type conductivity, such as phosphorus or arsenic, is added may be formed in the p-type semiconductor substrate.

Figure 4B:
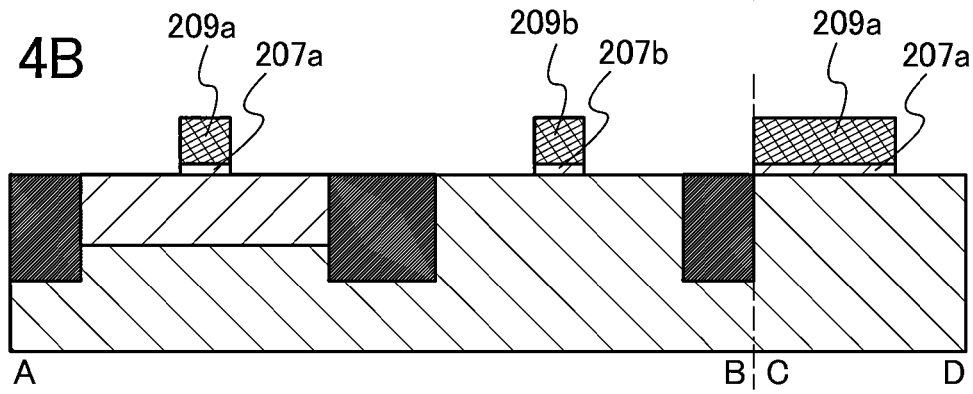

Next, as illustrated in FIG. 4B, a gate insulating film 207a, a gate insulating film 207b, a gate electrode 209a, and a gate electrode 209b are formed over the semiconductor substrate 201.

First, a surface of the semiconductor substrate 201 is oxidized by heat treatment, so that a silicon oxide film is formed. Alternatively, a silicon oxide film is formed by a thermal oxidation method, and then a surface of the silicon oxide film is nitrided by a nitridation treatment; thus, a stacked structure including the silicon oxide film and the silicon film containing oxygen and nitrogen (silicon oxynitride film) is formed. Next, part of the silicon oxide film or the silicon oxynitride film is selectively etched, so that the gate insulating film 207a and the gate insulating film 207b are formed. Alternatively, the gate insulating film 207a and the gate insulating film 207b are formed in such a manner that silicon oxide, silicon oxynitride, metal oxide such as tantalum oxide, hafnium oxide, hafnium silicate oxide, zirconium oxide, aluminum oxide, or titanium oxide, which is a high dielectric constant material (also referred to as a high-k material), a rare-earth oxide such as lanthanum oxide, or the like is formed to have a thickness of 5 nm to 50 nm by a CVD method, a sputtering method, or the like, and then part thereof is selectively etched.

It is preferable that the gate electrode 209a and the gate electrode 209b each be formed using a metal selected from tantalum, tungsten, titanium, molybdenum, chromium, niobium, and the like, or an alloy material or a compound material including any of the metals as its main component. Further, polycrystalline silicon to which an impurity element such as phosphorus is added can be used. Alternatively, the gate electrode 209a and the gate electrode 209b may have a stacked structure including a metal nitride film and a film of any of the above metals. As the metal nitride, tantalum nitride, tungsten nitride, molybdenum nitride, or titanium nitride can be used. When the metal nitride film is provided, adhesiveness of the metal film can be increased; accordingly, separation can be prevented.

The gate electrode 209a and the gate electrode 209b are formed in such a manner that a conductive film is formed by a sputtering method, a CVD method, or the like and then part of the conductive film is selectively etched.

Here, the surface of the semiconductor substrate 201 is oxidized by heat treatment, so that a silicon oxide film is formed; a conductive film including a stack of a tantalum nitride film and a tungsten film is formed over the silicon oxide film by a sputtering method; and then part of the silicon oxide film and part of the conductive film are selectively etched. Thus, the gate insulating film 207a, the gate insulating film 207b, the gate electrode 209a, and the gate electrode 209b are formed.

Note that when the characteristics of the transistor have priority, a structure may be employed in which sidewall insulating layers are provided on the side surfaces of the gate electrode 209a and the gate electrode 209b. However, for high integration, a structure in which sidewall insulating layers are not provided on side surfaces of the gate electrode 209a and the gate electrode 209b as illustrated in FIGS. 4A to 4D is preferable.

Figure 4C:
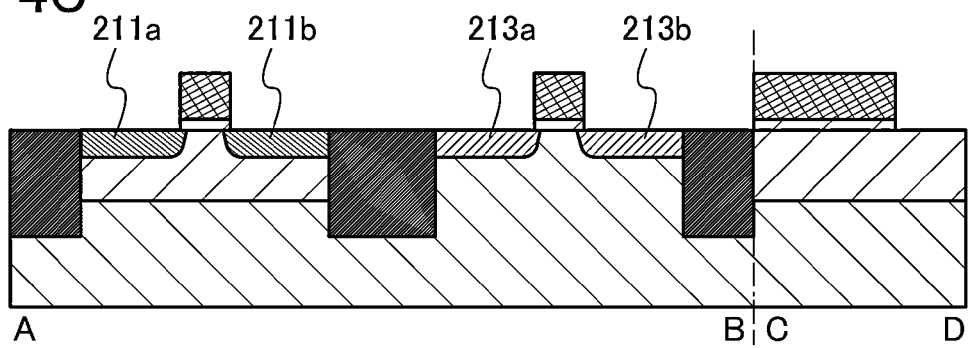

Next, as illustrated in FIG. 4C, an impurity element imparting p-type conductivity is added to the semiconductor substrate 201, so that a p-type impurity region 213a and a p-type impurity region 213b are formed. Further, an impurity element imparting n-type conductivity is added to the p-well region 205, so that an n-type impurity region 211a and an n-type impurity region 211b are formed. The concentration of the impurity element imparting n-type conductivity in the n-type impurity regions 211a and 211b is higher than or equal to $1 \times 10^{19}$ cm$^{-3}$ and lower than or equal to $1 \times 10^{21}$ cm$^{-3}$, and the concentration of the impurity element imparting p-type conductivity in the p-type impurity regions 213a and 213b is higher than or equal to $1 \times 10^{19}$ cm$^{-3}$ and lower than or equal to $1 \times 10^{21}$ cm$^{-3}$. The impurity element imparting n-type conductivity and the impurity element imparting p-type conductivity are added to the p-well region 205 and the semiconductor substrate 201, respectively, by an ion doping method, an ion implantation method, or the like as appropriate.

In the case where sidewall insulating layers are formed on the side surfaces of the gate electrode 209a and the gate electrode 209b, an impurity region having an impurity concentration different from that in the n-type impurity regions 211a and 211b and that in the p-type concentration regions 213a and 213b can be formed in regions overlapping with the sidewall insulating layers.

Figure 4D:
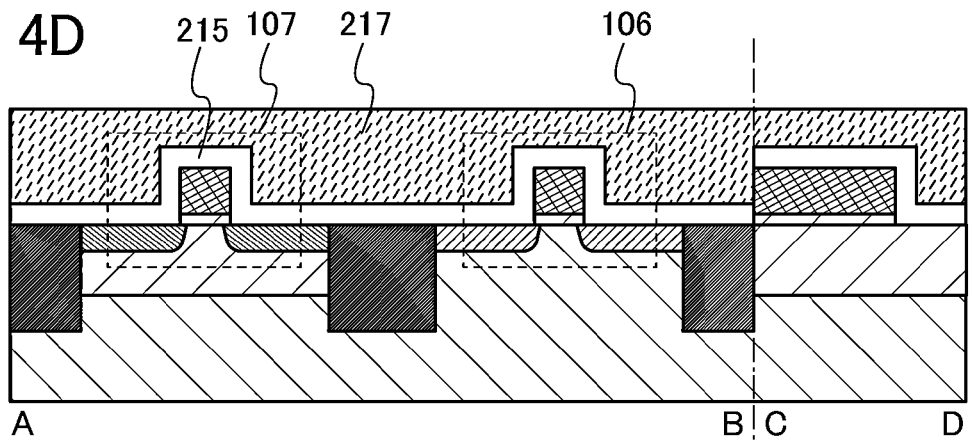

Next, as illustrated in FIG. 4D, an insulating film 215 and an insulating film 217 are formed by a sputtering method, a CVD method, or the like over the semiconductor substrate 201, the element isolation region 203, the gate insulating films 207a and 207b, and the gate electrodes 209a and 209b.

The insulating films 215 and 217 may each be formed with a single layer or a stack including one or more of silicon oxide, silicon oxynitride, silicon nitride oxide, silicon nitride, aluminum oxide, aluminum oxynitride, aluminum nitride oxide, aluminum nitride, and the like. When the insulating film 215 is formed by a CVD method, a hydrogen content of the insulating film 215 can be increased. When heat treatment is performed after such an insulating film 215 is formed, it is possible to hydrogenate the semiconductor substrate, to terminate a dangling bond by hydrogen, and to reduce defects in the semiconductor substrate.

Note that planarity of the insulating film 217 can be high when the insulating film 217 is formed using an inorganic material such as borophosphosilicate glass (BPSG), or an organic material such as polyimide or acrylic.

After the formation of the insulating film 215 or the insulating film 217, heat treatment is performed to activate the impurity elements added to the n-type impurity regions 211a and 211b and the p-type impurity regions 213a and 213b.

Through the above steps, as illustrated in FIG. 4D, the n-channel transistor 107 and the p-channel transistor 106 can be manufactured.

Next, part of each of the insulating films 215 and 217 is selectively etched to form opening portions. Then, contact plugs 219a to 219d are formed in the opening portions. Typically, the contact plugs 219a to 219d are formed in such a manner that after a conductive film is formed by a sputtering method, a CVD method, or the like, planarization treatment is performed by a chemical mechanical polishing (CMP) method, etching, or the like so that an unnecessary portion of the conductive film is removed.

The conductive film to be the contact plugs 219a to 219d is formed in such a manner that tungsten silicide is formed by a CVD method using a WF$_6$ gas and a SiH$_4$ gas to fill the opening portions.

Next, an insulating film is formed by a sputtering method, a CVD method, or the like over the insulating film 217 and the contact plugs 219a to 219d, and then, part of the insulating film is selectively etched to form an insulating film 221 having a groove portion. Next, after a conductive film is formed by a sputtering method, a CVD method, or the like, planarization treatment is performed by a CMP method, etching, or the like so that an unnecessary portion of the conductive film is removed; thus, wirings 223a to 223c are formed (see FIG. 5A).

The insulating film 221 can be formed using a material similar to that of the insulating film 215.

The wirings 223a to 223c are formed to have a single-layer structure or a stacked-layer structure including any of metals such as aluminum, titanium, chromium, nickel, copper, yttrium, zirconium, molybdenum, silver, tantalum, and tungsten and an alloy containing any of these metals as a main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is formed over a copper-magnesium-aluminum alloy film, and a three-layer structure in which a titanium film, an aluminum film, and a titanium film are stacked in this order can be given. Note that a transparent conductive material containing indium oxide, tin oxide, or zinc oxide may be used.

The insulating film 221 and the wirings 223a to 223c which are planarized are used, whereby variation in electrical characteristics of a transistor including an oxide semiconductor film, which is formed later, can be reduced. Further, the transistor including an oxide semiconductor film can be manufactured with a high yield.

Next, heat treatment or plasma treatment is preferably performed so that hydrogen contained in the insulating film 221 and the wirings 223a to 223c is released. Consequently, in heat treatment performed later, diffusion of hydrogen to an insulating film and an oxide semiconductor film to be formed later can be prevented. The heat treatment is performed at a temperature of higher than or equal to 100° C. and lower than the strain point of the substrate in an inert atmosphere, a reduced-pressure atmosphere, or a dry air atmosphere. Further, for the plasma treatment, a rare gas, oxygen, nitrogen, or nitrogen oxide (e.g., nitrous oxide, nitrogen monoxide, or nitrogen dioxide) is used.

Next, an insulating film 225 is formed by a sputtering method, a CVD method, or the like over the insulating film 221 and the wirings 223a to 223c. The insulating film 225 is formed with a single layer or a stack including one or more of silicon oxide, silicon oxynitride, silicon nitride oxide, gallium oxide, hafnium oxide, yttrium oxide, aluminum oxide, and aluminum oxynitride. The insulating film 225 is preferably formed using an oxide insulating film from which part of oxygen is released by heating. As the oxide insulating film from which part of oxygen is released by heating, an oxide insulating film containing oxygen at a proportion exceeding the stoichiometric proportion is used. Oxygen is released by heating from the oxide insulating film from which part of oxygen is released by heating; therefore, oxygen can be diffused into the oxide semiconductor film by heating performed in a later step.

The insulating film 225 is preferably planarized by CMP treatment or the like. The surface of the insulating film 225 has an average surface roughness ($R_a$) of 1 nm or less, preferably 0.3 nm or less, further preferably 0.1 nm or less.

Note that in this specification and the like, the average surface roughness ($R_a$) is obtained by three-dimensional expansion of center line average surface roughness ($R_a$) which is defined by JIS B 0601:2001 (ISO 4287:1997) so that $R_a$ can be applied to a measurement surface, and is an average value of the absolute values of deviations from a reference surface to a specific surface.

When the measurement surface which is a surface represented by measurement data is expressed as $Z=F(X,Y)$, the average surface roughness ($R_a$) is an average value of the absolute values of deviations from the reference surface to the specific surface and is shown by the following formula (1).

[Formula 1]

$$R_a = \frac{1}{S_0} \int_{Y_1}^{Y_2} \int_{X_1}^{X_2} |F(X, Y) - Z_0| dX dY \quad (1)$$

Here, the specific surface is a surface which is a target of roughness measurement, and is a rectangular region which is surrounded by four points represented by the coordinates $(X_1, Y_1)$, $(X_1, Y_2)$, $(X_2, Y_1)$, and $(X_2, Y_2)$. $S_0$ represents the area of the specific surface when the specific surface is flat ideally. In addition, the reference surface refers to a surface parallel to an X-Y surface at the average height of the specific surface. In short, when the average value of the height of the specific surface is denoted by $Z_0$, the height of the reference surface is also denoted by $Z_0$. The average surface roughness ($R_a$) can be measured using an atomic force microscope (AFM).

The CMP treatment may be performed once or plural times. When the CMP treatment is performed plural times, first polishing is preferably performed with a high polishing rate followed by final polishing with a low polishing rate. By performing polishing steps with different polishing rates in combination, the planarity of the surface of the insulating film 225 can be further increased.

Alternatively, plasma treatment can be used as the planarization treatment of the insulating film 225. The plasma treatment is performed in such a manner that an inert gas, for example, a rare gas such as an argon gas is introduced into a vacuum chamber and an electric field is applied so that a surface to be processed serves as a cathode. The plasma treatment has a principle similar to that of a plasma dry etching method and an inert gas is used in the plasma treatment. In other words, the plasma treatment is treatment in which the surface to be processed is irradiated with ions of an inert gas and is planarized by a sputtering effect through removal of minute projections and depressions on the surface. Therefore, the plasma treatment can also be referred to as "reverse sputtering treatment".

In the plasma treatment, electrons and argon cations are present in plasma and the argon cations are accelerated in a cathode direction. The surface to be processed is sputtered by the accelerated argon cations. At this time, projections on the surface to be processed are preferentially sputtered. Particles generated by sputtering from the surface to be processed attach to another place of the surface to be processed. At this time, the particles are preferentially attached to depressions in the surface to be processed. In this manner, by reducing the projections and filling the depressions, the planarity of the surface to be processed can be improved. Note that a combination of plasma treatment and CMP treatment can further planarize the insulating film 225.

Note that through the plasma treatment, it is possible to remove impurities such as moisture and an organic substance attached onto the surface of the insulating film 225 by a sputtering effect.

It is preferable that impurities such as hydrogen, water, a hydroxyl group, and hydride in a treatment chamber be removed by heating and evacuation of the treatment chamber before formation of the oxide semiconductor film. It is particularly important to remove such impurities adsorbed on an inner wall of the treatment chamber. Here, the heat treatment may be performed at a temperature of higher than or equal to 100° C. and lower than or equal to 450° C., for example. Evacuation of the treatment chamber is preferably performed with a rough vacuum pump such as a dry pump, and a high vacuum pump such as a sputter ion pump, a turbo molecular pump, or a cryopump, in appropriate combination. The turbo molecular pump has an outstanding capability in evacuating a large-sized molecule, whereas it has a low capability in evacuating hydrogen or water. Hence, combination of the turbo molecular pump and a cryopump having a high capability in evacuating water or a sputter ion pump having a high capability in evacuating hydrogen is effective. At this time, when the impurities are removed while an inert gas is introduced, the rate of desorption of water or the like, which is difficult to desorb only by evacuation, can be further increased. Removal of impurities from the treatment chamber by such treatment before the formation of the oxide semiconductor film can prevent hydrogen, water, a hydroxyl group, hydride, and the like from entering the oxide semiconductor.

Before the oxide semiconductor film is formed by a sputtering apparatus, a dummy substrate may be put into the sputtering apparatus, and an oxide semiconductor film may be formed over the dummy substrate, so that hydrogen and moisture attached to the target surface or a deposition shield may be removed.

Figure 5A:
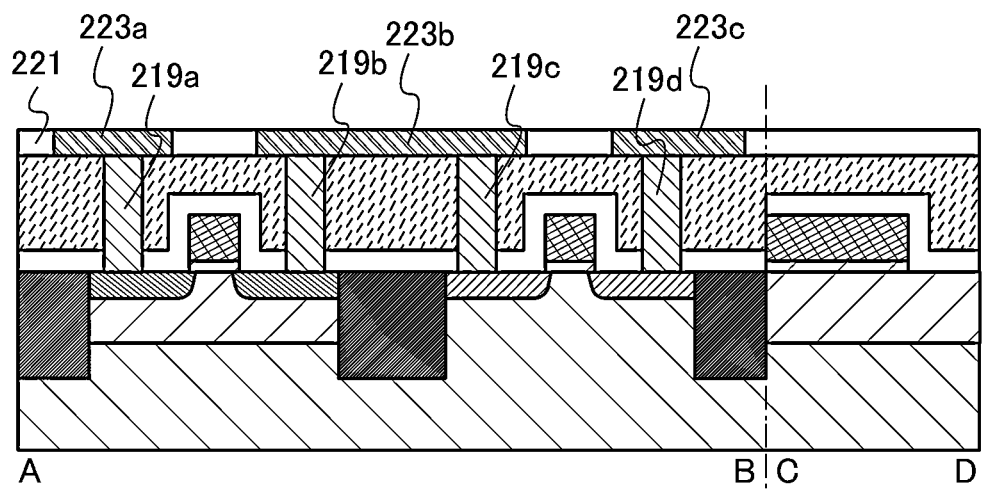
FIGS. 5A and 5B illustrate steps of manufacturing a transistor in a logic circuit according to an embodiment of the present invention.
Figure 5B:
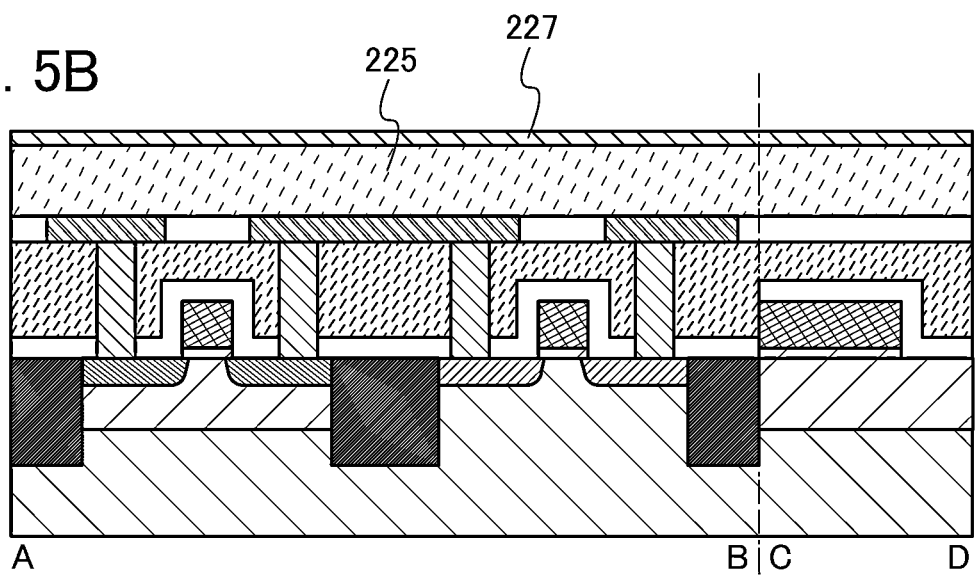

Next, an oxide semiconductor film 227 is formed over the insulating film 225 by a sputtering method, a coating method, a printing method, a pulsed laser evaporation method, or the like (see FIG. 5B). Here, as the oxide semiconductor film 227, an oxide semiconductor film having a thickness of greater than or equal to 1 nm and less than or equal to 50 nm, preferably greater than or equal to 3 nm and less than or equal to 30 nm is formed by a sputtering method. When the oxide semiconductor film 227 has a thickness in the above range, a short-channel effect which might be caused due to miniaturization of the transistor can be suppressed.

An oxide semiconductor used for the oxide semiconductor film 227 preferably contains at least indium (In) or zinc (Zn). In particular, In and Zn are preferably contained. As a stabilizer for reducing variation in electrical characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide. Further, silicon oxide may be included in the above oxide semiconductor. Here, for example, an In—Ga—Zn-based oxide means an oxide containing indium (In), gallium (Ga), and zinc (Zn) as its main components and there is no particular limitation on the ratio of In:Ga:Zn. The In—Ga—Zn-based oxide may contain a metal element other than In, Ga, and Zn. In this case, the amount of oxygen in the oxide semiconductor preferably exceeds the stoichiometric proportion of oxygen. When the amount of oxygen exceeds the stoichiometric proportion, generation of carriers which results from oxygen vacancies in the oxide semiconductor film can be suppressed.

Alternatively, a material represented by $InMO_3(ZnO)_m$ (m>0, and m is not an integer) may be used as the oxide semiconductor. Note that M represents one or more metal elements selected from Ga, Fe, Mn, and Co. Alternatively, as the oxide semiconductor, a material represented by $In_3SnO_5(ZnO)_n$ (n>0, and n is an integer) may be used.

Note that the concentration of an alkali metal or an alkaline earth metal in the oxide semiconductor film 227 is preferably lower than or equal to $1\times10^{18}$ atoms/cm$^3$, more preferably lower than or equal to $2\times10^{16}$ atoms/cm$^3$. When an alkali metal or an alkaline earth metal is bonded to an oxide semiconductor, carriers are generated in some cases, which cause an increase in the off-state current of the transistor.

The oxide semiconductor film 227 may contain nitrogen at a concentration of lower than or equal to $5\times10^{18}$ atoms/cm$^3$.

As an oxide semiconductor which can be used for the oxide semiconductor film 227, a wide bandgap semiconductor which has a wider bandgap and lower intrinsic carrier density than silicon is used. The off-state current of a transistor can be reduced with the use of an oxide semiconductor having a wide bandgap.

The oxide semiconductor film 227 may have a single crystal structure or a non-single-crystal structure. In the latter case, the oxide semiconductor film 227 may have either an amorphous structure or a polycrystal structure. Further, the oxide semiconductor film 227 may have an amorphous structure including a portion having crystallinity or a non-amorphous structure.

In an oxide semiconductor in an amorphous state, a flat surface can be obtained with relative ease, so that when a transistor is manufactured with the use of the oxide semiconductor, interface scattering can be reduced, and relatively high mobility can be obtained with relative ease.

In an oxide semiconductor having crystallinity, defects in the bulk can be further reduced and when surface flatness is improved, mobility higher than that of an oxide semiconductor in an amorphous state can be obtained. In order to improve the surface flatness, the oxide semiconductor is preferably formed over a flat surface. As described above, the average surface roughness ($R_a$) of the surface of the insulating film 225 is 1 nm or less, preferably 0.3 nm or less, further preferably 0.1 nm or less, and the oxide semiconductor film 227 is preferably formed thereover.

Here, the oxide semiconductor film 227 is formed by a sputtering method.

For example, as a target used in the sputtering method, the following can be given: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

In the case where an In—Ga—Zn—O-based material is used as an oxide semiconductor, a target to be used may have a composition ratio of In:Ga:Zn=1:1:1 in atomic ratio (=1/3:1/3:1/3) ($In_2O_3:Ga_2O_3:ZnO=1:1:2$ in molar ratio), In:Ga:Zn=2:2:1 in atomic ratio (=2/5:2/5:1/5) ($In_2O_3:Ga_2O_3:ZnO=1:1:1$ in molar ratio), or the like, for example. A target of an In—Ga—Zn-based oxide having any of the above atomic ratios or an oxide whose composition is in the neighborhood of the above compositions can be used.

In the case where an In—Sn—Zn—O-based material is used as an oxide semiconductor, a target to be used may have a composition ratio of In:Sn:Zn=1:1:1 (=1/3:1/3:1/3), In:Sn:Zn=2:1:3 (=1/3:1/6:1/2), In:Sn:Zn=2:1:5 (=1/4:1/8:5/8), In:Sn:Zn=1:2:2 (=1/5:2/5:2/5), In:Sn:Zn=20:45:35, or the like in atomic ratio, for example. A target of an In—Sn—Zn-based oxide having any of the above atomic ratios or an oxide whose composition is in the neighborhood of the above compositions can be used.

In the case where an In—Zn—O-based material is used as the oxide semiconductor, a target to be used has a composition ratio of In:Zn=50:1 to 1:2 in atomic ratio ($In_2O_3$:ZnO=25:1 to 1:4 in molar ratio), preferably In:Zn=20:1 to 1:1 in atomic ratio ($In_2O_3$:ZnO=10:1 to 1:2 in molar ratio), more preferably In:Zn=15:1 to 1.5:1 in atomic ratio ($In_2O_3$:ZnO=15:2 to 3:4 in molar ratio). For example, in a target used for formation of an In—Zn—O-based oxide semiconductor which has an atomic ratio of In:Zn:O=X:Y:Z, the relation of Z>1.5X+Y is satisfied. A target of an In—Zn—O-based oxide having any of the above atomic ratios or an oxide whose composition is in the neighborhood of the above compositions can be used.

However, the composition is not limited to those described above, and a material having the appropriate composition may be used depending on necessary semiconductor characteristics (e.g., mobility, threshold voltage, and variation). In order to obtain necessary semiconductor characteristics, it is preferable that the carrier density, the impurity concentration, the defect density, the atomic ratio of a metal element to oxygen, the interatomic distance, the density, and the like be set to be appropriate.

For example, with the In—Sn—Zn-based oxide, a high mobility can be relatively easily obtained. However, the mobility can be increased by reducing the defect density in the bulk also in the case of using the In—Ga—Zn-based oxide.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

As a sputtering gas, a rare gas (typically argon) atmosphere, an oxygen atmosphere, or a mixed gas of a rare gas and oxygen is used as appropriate. In the case of using the mixed gas of a rare gas and oxygen, the proportion of oxygen is preferably higher than that of a rare gas. Further, in order to prevent hydrogen, water, a hydroxyl group, hydride, and the like from entering the oxide semiconductor film, as a sputtering gas, it is preferable to use an atmosphere of a high-purity gas from which impurities such as hydrogen, water, a hydroxyl group, and hydride are sufficiently removed.

In a sputtering method, an RF power supply device, an AC power supply device, a DC power supply device, or the like can be used as a power supply device for generating plasma as appropriate.

The leakage rate of a treatment chamber in which the oxide semiconductor film is formed is preferably lower than or equal to $1\times10^{-10}$ Pa·m$^3$/sec., whereby entry of an impurity into the film to be formed by a sputtering method can be decreased. As described above, in the process for forming the oxide semiconductor film and preferably in the process for forming the oxide insulating film, entry of impurities is suppressed as much as possible through control of the pressure of the treatment chamber, leakage rate of the treatment chamber, and the like, whereby entry of impurities including hydrogen into the oxide semiconductor film can be reduced. In addition, diffusion of impurities such as hydrogen from the oxide insulating film to the oxide semiconductor film can be reduced.

As the oxide semiconductor film 227, a c-axis aligned crystalline oxide semiconductor (CAAC-OS) film may be used.

The CAAC-OS means an oxide semiconductor including a crystal which has c-axis alignment and a triangular or hexagonal atomic arrangement when seen from the direction of an a-b plane, a surface, or an interface. In the crystal, metal atoms are arranged in a layered manner, or metal atoms and oxygen atoms are arranged in a layered manner along the c-axis, and the direction of the a-axis or the b-axis is varied in the a-b plane (or the surface, or at the interface) (the crystal rotates around the c-axis).

The CAAC-OS means, in a broad sense, a non-single-crystal oxide semiconductor including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC-OS is not a single crystal, but this does not mean that CAAC-OS is composed of only an amorphous component. Although the CAAC-OS includes a crystallized portion (crystalline portion), a boundary between one crystalline portion and another crystalline portion is not clear in some cases.

Part of oxygen included in the CAAC-OS may be substituted with nitrogen. The c-axes of individual crystalline portions included in the CAAC-OS may be aligned in one direction (e.g., a direction perpendicular to a surface of a substrate over which the CAAC-OS is formed, a surface of the CAAC-OS, or an interface of the CAAC-OS). Alternatively, normals of the a-b planes of individual crystalline portions included in the CAAC-OS may be aligned in one direction (e.g., the direction perpendicular to a surface of a substrate over which the CAAC-OS is formed, a surface of the CAAC-OS, or an interface of the CAAC-OS, or the like).

When such an oxide semiconductor film including a crystal having c-axis alignment is provided, changes in the electrical characteristics due to irradiation with visible light or ultraviolet light can be suppressed. It is particularly preferable that the insulating film 225 have an average surface roughness ($R_a$) of 1 nm or less, preferably 0.3 nm or less, more preferably 0.1 nm or less, and that the oxide semiconductor film including a crystal having c-axis alignment be formed thereover. Accordingly, the crystallinity of the oxide semiconductor film including a crystal having c-axis alignment can be improved, and the mobility of the transistor including the oxide semiconductor film can be increased.

Examples of crystal structures of the CAAC-OS will be described in detail with reference to FIGS. 10A to 10E, FIGS. 11A to 11C, and FIGS. 12A to 12C. In FIGS. 10A to 10E, FIGS. 11A to 11C, and FIGS. 12A to 12C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 10A to 10E, O surrounded by a circle represents tetracoordinate O and O surrounded by a double circle represents tricoordinate O.

Figure 10A:
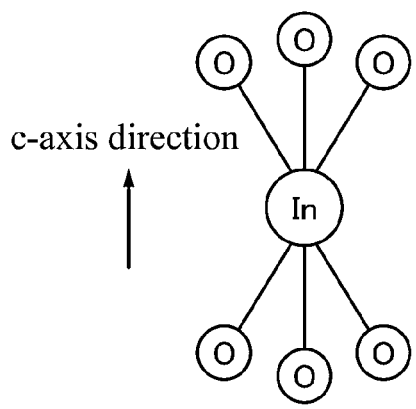
FIGS. 10A to 10E illustrate structures of oxide materials according to one embodiment of the present invention.

FIG. 10A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 10A is actually an octahedral structure, but is illustrated as a planar structure for simplicity. Note that three tetracoordinate O atoms exist in each of an upper half and a lower half in FIG. 10A. In the small group illustrated in FIG. 10A, electric charge is 0.

Figure 10D:
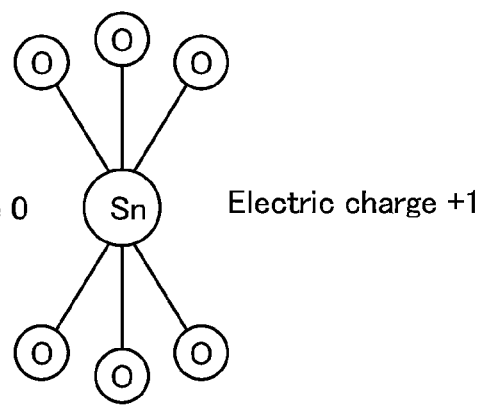
Figure 10B:
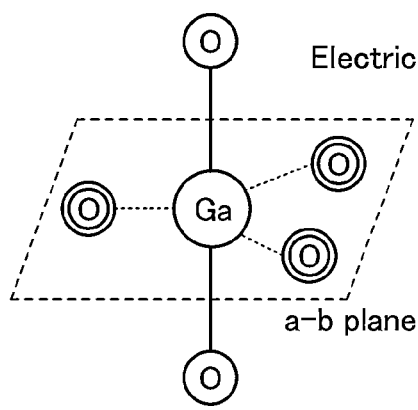

FIG. 10B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 10B. An In atom can also have the structure illustrated in FIG. 10B because an In atom can have five ligands. In the small group illustrated in FIG. 10B, electric charge is 0.

Figure 10E:
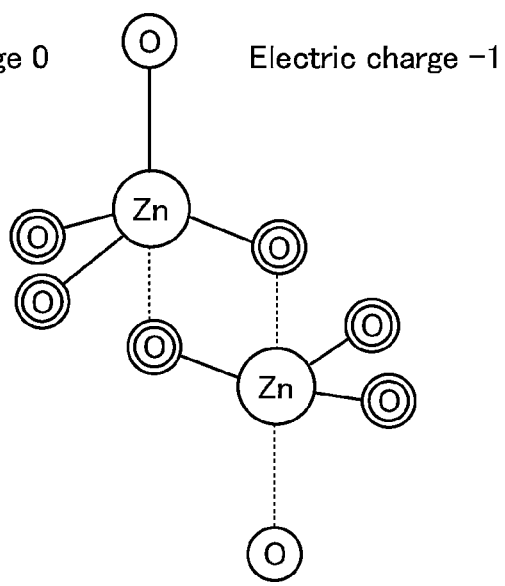
Figure 10C:
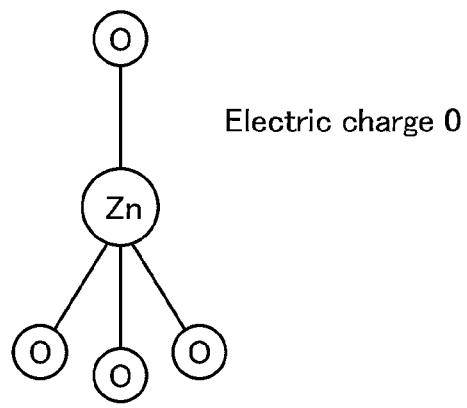

FIG. 10C illustrates a structure including one tetracoordinate Zn atom and four tetracoordinate O atoms proximate to the Zn atom. In FIG. 10C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 10C. In the small group illustrated in FIG. 10C, electric charge is 0.

FIG. 10D illustrates a structure including one hexacoordinate Sn atom and six tetracoordinate O atoms proximate to the Sn atom. In FIG. 10D, three tetracoordinate O atoms exist in each of an upper half and a lower half. In the small group illustrated in FIG. 10D, electric charge is +1.

FIG. 10E illustrates a small group including two Zn atoms. In FIG. 10E, one tetracoordinate O atom exists in each of an upper half and a lower half. In the small group illustrated in FIG. 10E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 10A each have three proximate In atoms in the downward direction, and the three O atoms in the lower half each have three proximate In atoms in the upward direction. The one O atom in the upper half with respect to the pentacoordinate Ga atom in FIG. 10B has one proximate Ga atom in the downward direction, and the one O atom in the lower half has one proximate Ga atom in the upward direction. The one O atom in the upper half with respect to the tetracoordinate Zn atom in FIG. 10C has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

Figure 11A:
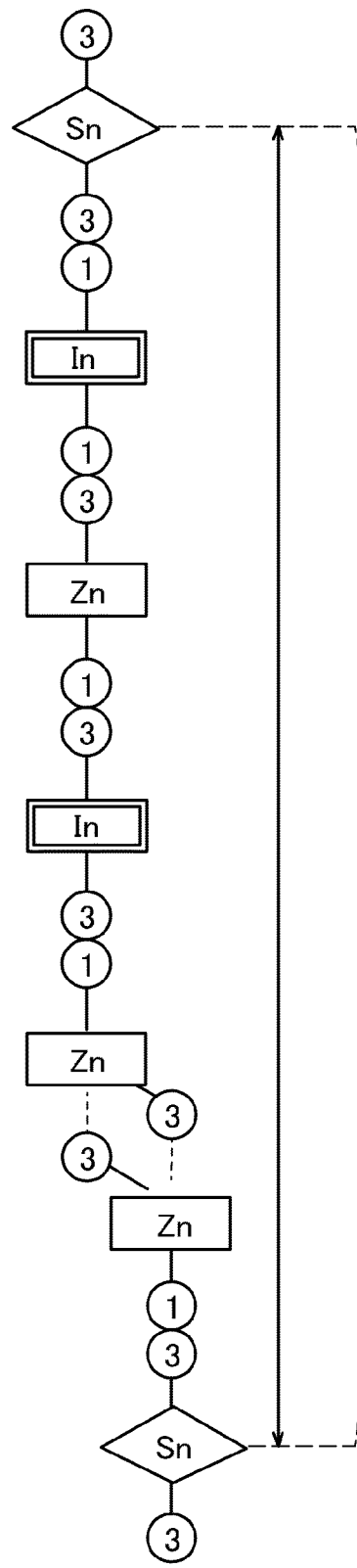
FIGS. 11A to 11C illustrate a structure of an oxide material according to one embodiment of the present invention.
Figure 11B:
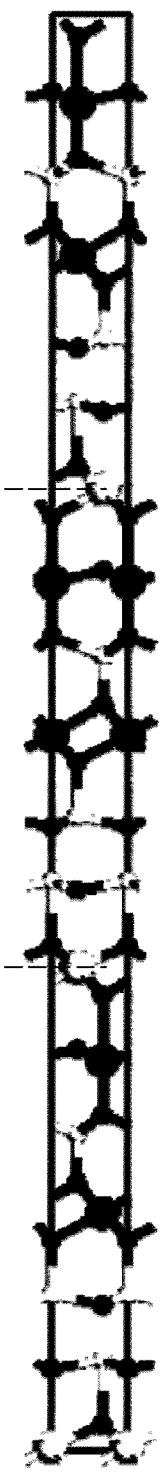
Figure 11C:
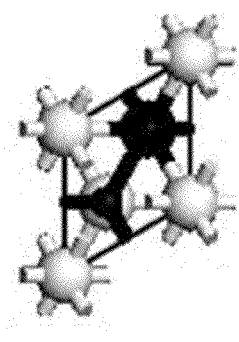

FIG. 11A illustrates a model of a medium group included in a layered structure of an In—Sn—Zn—O-based material. FIG. 11B illustrates a large group including three medium groups. Note that FIG. 11C illustrates an atomic arrangement in the case where the layered structure in FIG. 11B is observed from the c-axis direction.

In FIG. 11A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 11A, one tetracoordinate O atom existing in each of an upper half and a lower half with respect to an In atom is denoted by circled 1. FIG. 11A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 11A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups is bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 10E can be given. For example, with one small group including two Zn atoms, electric charge of one small group including a Sn atom can be cancelled, so that the total electric charge of the layered structure can be 0.

When the large group illustrated in FIG. 11B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

Figure 12A:
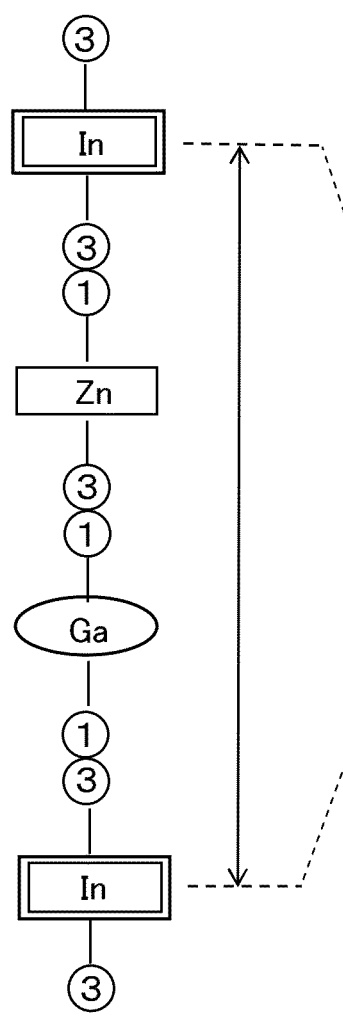
FIGS. 12A to 12C illustrate a structure of an oxide material according to one embodiment of the present invention.

As an example, FIG. 12A illustrates a model of a medium group included in a layered structure of an In—Ga—Zn—O-based material.

In the medium group included in the layered structure of the In—Ga—Zn—O-based material in FIG. 12A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups is bonded, so that a large group is formed.

Figure 12B:
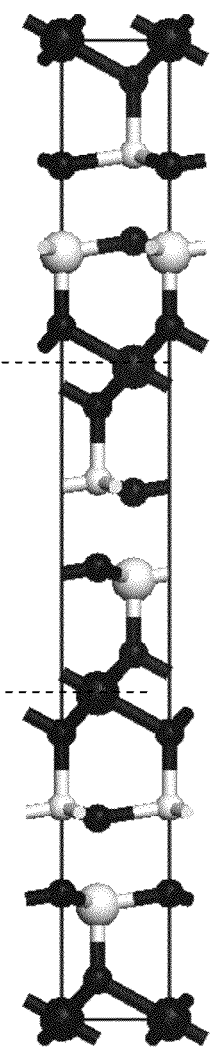
Figure 12C:
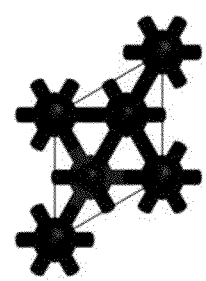

FIG. 12B illustrates a large group including three medium groups. Note that FIG. 12C illustrates an atomic arrangement in the case where the layered structure in FIG. 12B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 12A but also a medium group in which the arrangement of the In atom, the Ga atom, and the Zn atom is different from that in FIG. 12A.

In the case where the oxide semiconductor film 227 is the CAAC-OS film, the substrate is heated so that the substrate temperature in the formation of the oxide semiconductor film 227 is higher than 200° C. and lower than or equal to 700° C., preferably higher than 300° C. and lower than or equal to 500° C., more preferably higher than or equal to 400° C. and lower than or equal to 450° C. The oxide semiconductor film 227 is formed while the substrate is heated in this manner, whereby the oxide semiconductor film 227 can be the CAAC-OS film.

Alternatively, a first oxide semiconductor film having a thickness of greater than or equal to a thickness of one atomic layer and less than or equal to 10 nm, preferably greater than or equal to 2 nm and less than or equal to 5 nm, which is thin, is formed while the heating is performed at temperature in the above range, and then a second oxide semiconductor film which is thick is formed while heating is performed in a similar manner; thus, the first oxide semiconductor film and the second oxide semiconductor film may be stacked to form the oxide semiconductor film 227 including the CAAC-OS.

In the case where the oxide semiconductor film 227 has an amorphous structure, the substrate is not heated or the substrate is heated so that the substrate temperature is lower than 200° C., preferably lower than 180° C. in the formation of the oxide semiconductor film 227. The oxide semiconductor film 227 is formed in this manner, whereby the oxide semiconductor film 227 can have an amorphous structure.

Alternatively, the oxide semiconductor film 227 including the CAAC-OS may be formed in the following manner: after an oxide semiconductor film having an amorphous structure is formed in the above manner, heat treatment at a temperature of higher than or equal to 250° C. and lower than or equal to 700° C., preferably higher than or equal to 400° C., more preferably higher than or equal to 500° C., still more preferably higher than or equal to 550° C. is performed, so that at least part of the oxide semiconductor film having an amorphous structure is crystallized. Note that the heat treatment can be performed in an inert gas atmosphere. The inert gas atmosphere is preferably an atmosphere which contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is greater than or equal to 6N (99.9999%), preferably greater than or equal to 7N (99.99999%) (that is, the concentration of the impurities is lower than or equal to 1 ppm, preferably lower than or equal to 0.1 ppm). Heat treatment for hydration or hydrogenation, which is described later, can serve as this heat treatment.

After the oxide semiconductor film 227 is formed, the oxide semiconductor film 227 may be subjected to heat treatment (first heat treatment). The heat treatment can further remove a substance including a hydrogen atom in the oxide semiconductor film 227; thus, a structure of the oxide semiconductor film 227 can be improved and defect levels in the band gap can be reduced. The heat treatment is performed in an inert gas atmosphere at a temperature of higher than or equal to 300° C. and lower than or equal to 700° C., preferably higher than or equal to 450° C. and lower than or equal to 600° C. In the case where the substrate has the strain point, the heat treatment is performed at a temperature lower than the strain point of the substrate. The inert gas atmosphere is preferably an atmosphere which contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is greater than or equal to 6N (99.9999%), preferably greater than or equal to 7N (99.99999%) (that is, the concentration of the impurities is lower than or equal to 1 ppm, preferably lower than or equal to 0.1 ppm).

The heat treatment can be performed in such a way that, for example, the semiconductor substrate 201 is introduced into an electric furnace using a resistance heating element or the like and heated at 450° C. under a nitrogen atmosphere for an hour.

The heat treatment apparatus is not limited to the electric furnace and may be an apparatus for heating an object to be processed by thermal radiation or thermal conduction from a medium such as a heated gas. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon, is used. Note that in the case where a GRTA apparatus is used as the heat treatment apparatus, the substrate may be heated in an inert gas heated to a high temperature of 650° C. to 700° C. because the heat treatment time is short.

In addition, after the oxide semiconductor film 227 is heated by the heat treatment, a high-purity oxygen gas, a high-purity $N_2O$ gas, or ultra dry air (with a moisture content of 20 ppm (equivalent to a dew point of −55° C.) or less, preferably 1 ppm or less, further preferably 10 ppb or less, when measured with a dew point meter using cavity ring down laser spectroscopy (CRDS)) may be introduced into the same furnace. It is preferable that water, hydrogen, and the like be not contained in these gases in particular. The purity of the oxygen gas or the $N_2O$ gas that is introduced into the same furnace is preferably 6N or higher, further preferably 7N or higher (i.e., the concentration of impurities in the oxygen gas or the $N_2O$ gas is 1 ppm or lower, preferably 0.1 ppm or lower). By the action of the oxygen gas or the $N_2O$ gas, oxygen which is one of main components of the oxide semiconductor and which has been eliminated at the same time as the step for removing impurities by dehydration or dehydrogenation can be supplied.

Note that the heat treatment can be referred to as dehydration treatment, dehydrogenation treatment, or the like because of its advantageous effect of removing hydrogen, water, or the like. The heat treatment can be performed at the timing, for example, before the oxide semiconductor layer is processed to have an island shape, after the gate insulating film is formed, or the like. Such heat treatment for dehydration or dehydrogenation may be performed once or plural times.

Next, part of the oxide semiconductor film 227 is selectively etched to form an oxide semiconductor film 229. Then, an insulating film 231 is formed over the oxide semiconductor film 229 by a sputtering method, a CVD method, or the like. After that, a gate electrode 233 is formed over the insulating film 231 (see FIG. 6A).

The insulating film 231 may be formed with a single layer or a stack using one or more of silicon oxide, silicon oxynitride, silicon nitride oxide, silicon nitride, aluminum oxide, hafnium oxide, gallium oxide, a Ga—Zn—O-based metal oxide, and the like. The insulating film 231 may also be an oxide insulating film from which oxygen is released by heating, such as a film that can be used as the insulating film 225. By using a film from which oxygen is released by heating as the insulating film 231, oxygen vacancies caused in the oxide semiconductor film 229 can be reduced by heat treatment performed later and deterioration of electrical characteristics of the transistor can be suppressed.

When the insulating film 231 is formed using a high-k material such as hafnium silicate ($HfSiO_x$), hafnium silicate to which nitrogen is added ($HfSi_xO_xN_z$), hafnium aluminate to which nitrogen is added ($HfAl_xO_yN_z$), hafnium oxide, or yttrium oxide, gate leakage current can be decreased even when the thickness of the gate insulating film is reduced.

The thickness of the insulating film 231 is preferably greater than or equal to 10 nm and less than or equal to 300 nm, more preferably greater than or equal to 5 nm and less than or equal to 50 nm, still more preferably greater than or equal to 10 nm and less than or equal to 30 nm.

The gate electrode 233 can be formed using a metal element selected from aluminum, chromium, copper, tantalum, titanium, molybdenum, and tungsten; an alloy containing any of these metal elements as a component; or the like. Further, one or both metal elements of manganese and zirconium may be used. Further, the gate electrode 233 may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, a three-layer structure in which a titanium film, an aluminum film, and a titanium film are stacked in this order, and the like can be given. Alternatively, an alloy film or a nitride film of aluminum and one or more elements selected from titanium, tantalum, tungsten, molybdenum, chromium, neodymium, and scandium may be used.

The gate electrode 233 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to employ a stacked-layer structure formed using the above light-transmitting conductive material and the above metal element.

The gate electrode 233 is formed by a printing method or an inkjet method. Alternatively, the gate electrode 233 is formed in such a manner that a conductive film is formed by a sputtering method, a CVD method, an evaporation method, or the like and then part of the conductive film is selectively etched.

As a material layer in contact with the insulating film 231, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a film of a metal nitride (such as InN or ZnN) is preferably provided between the gate electrode 233 and the insulating film 231. These films each have a work function of higher than or equal to 5 eV, preferably higher than or equal to 5.5 eV; thus, the threshold voltage of the transistor can be positive. Accordingly, a so-called normally-off switching element can be obtained. For example, in the case of using an In—Ga—Zn—O film containing nitrogen, an In—Ga—Zn—O film having at least a higher nitrogen concentration than the oxide semiconductor film 229, specifically, an In—Ga—Zn—O film having a nitrogen concentration of higher than or equal to 7 at. % is used.

Heat treatment is preferably performed after that. Through this heat treatment, oxygen can be diffused from the insulating film 225 and the insulating film 231 to the oxide semiconductor film 229 to repair the oxygen defects included in the oxide semiconductor film 229; thus, the oxygen defects can be reduced.

Note that after the insulating film 231 is formed, heat treatment (second heat treatment) may be performed in an inert gas atmosphere or an oxygen atmosphere. The heat treatment temperature is preferably higher than or equal to 200° C. and lower than or equal to 450° C., more preferably higher than or equal to 250° C. and lower than or equal to 350° C. By performing such heat treatment, variation in electrical characteristics of the transistor can be reduced. In the case where oxygen is contained in the insulating film 231 or the insulating film 225 which is in contact with the oxide semiconductor film 229, oxygen can be supplied to the oxide semiconductor film 229 and the oxygen defects in the oxide semiconductor film 229 can be repaired. As described above, the heat treatment has an effect of supplying oxygen; therefore, the heat treatment can also be referred to as supply of oxygen.

Note that in this embodiment, the heat treatment for supply of oxygen is performed after the insulating film 231 is formed; however, the timing of the heat treatment for supply of oxygen is not limited thereto and the heat treatment may be performed after formation of the insulating film 231 as appropriate.

As described above, the heat treatment for dehydration or dehydrogenation and the heat treatment for supply of oxygen are performed to reduce impurities and fill oxygen vacancies in the oxide semiconductor film 229, whereby the oxide semiconductor film 229 can be highly purified so as to contain impurity elements that are not main components of the oxide semiconductor film 229 as little as possible.

Figure 6A:
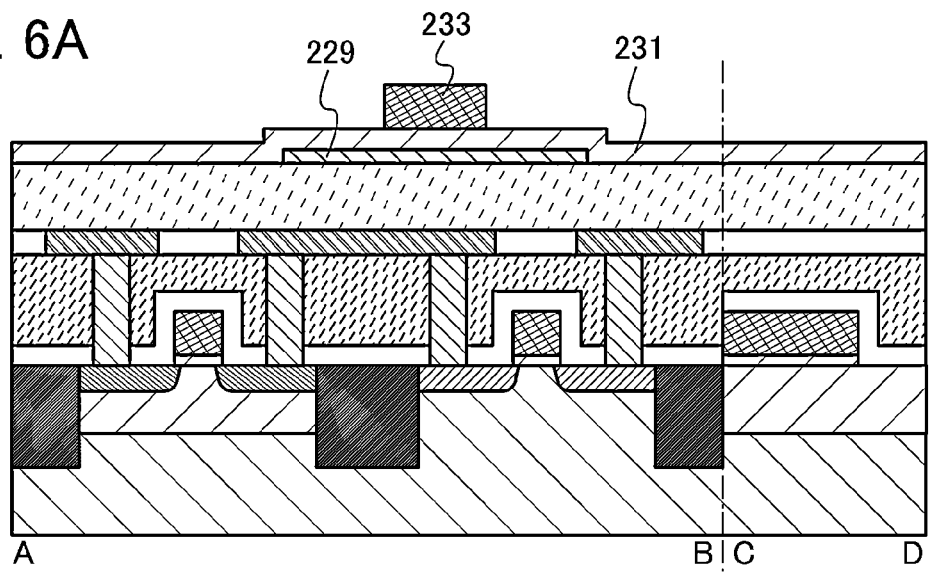
FIGS. 6A to 6C illustrate steps of manufacturing a transistor in a logic circuit according to an embodiment of the present invention.
Figure 6B:
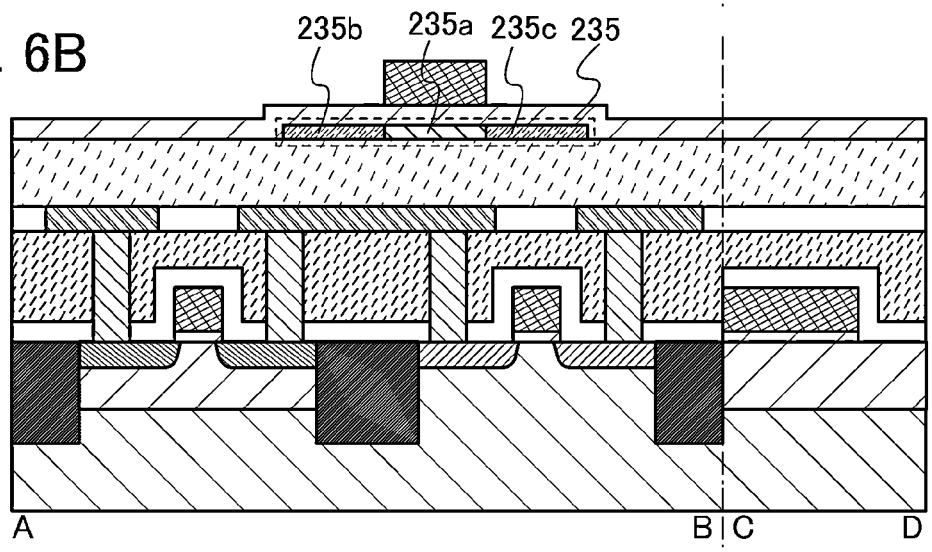

Next, treatment for adding a dopant to the oxide semiconductor film 229 is performed with the use of the gate electrode 233 as a mask. As a result, as illustrated in FIG. 6B, a first region 235a which is covered with the gate electrode 233 and to which the dopant is not added and a pair of second regions 235b and 235c containing the dopant are formed. Since the dopant is added with the use of the gate electrode 233 as a mask, the first region 235a to which the dopant is not added and the pair of second regions 235b and 235c containing the dopant can be formed in a self-aligned manner. The first region 235a which overlaps with the gate electrode 233 serves as a channel region. The pair of second regions 235b and 235c containing the dopant serves as a source region and a drain region. The first region 235a and the pair of second regions 235b and 235c containing the dopant constitute an oxide semiconductor film 235.

The concentration of hydrogen in the first region 235a of the oxide semiconductor film 235 is preferably lower than $5\times10^{18}$ atoms/cm$^3$, more preferably lower than or equal to $1\times10^{18}$ atoms/cm$^3$, still more preferably lower than or equal to $5\times10^{17}$ atoms/cm$^3$, still more preferably lower than or equal to $1\times10^{16}$ atoms/cm$^3$. By a bond of an oxide semiconductor and hydrogen, part of contained hydrogen serves as a donor to generate electrons as carriers. For that reason, by reduction in the concentration of hydrogen in the first region 235a of the oxide semiconductor film 235, a negative shift of the threshold voltage can be reduced.

The concentration of the dopant in the pair of second regions 235b and 235c is higher than or equal to $5\times10^{18}$ atoms/cm$^3$ and lower than or equal to $1\times10^{22}$ atoms/cm$^3$, preferably higher than or equal to $5\times10^{18}$ atoms/cm$^3$ and lower than $5\times10^{19}$ atoms/cm$^3$.

Since the pair of second regions 235b and 235c contains the dopant, the carrier density or the number of defects can be increased. Therefore, the conductivity can be higher than that of the first region 235a which does not contain the dopant. Note that an excessive increase in the concentration of dopant causes the dopant to inhibit carrier movement, which leads to a reduction in conductivity of the pair of second regions 235b and 235c containing the dopant.

The pair of second regions 235b and 235c containing the dopant preferably has a conductivity of higher than or equal to 0.1 S/cm and lower than or equal to 1000 S/cm, preferably higher than or equal to 10 S/cm and lower than or equal to 1000 S/cm.

As a method for adding the dopant to the oxide semiconductor film 229, an ion doping method or an ion implantation method can be used. As the dopant, at least one of boron, nitrogen, phosphorus, and arsenic can be added. Alternatively, as the dopant, at least one of helium, neon, argon, krypton, and xenon can be added. Further alternatively, hydrogen may be added as the dopant. Still alternatively, as the dopant, at least one of boron, nitrogen, phosphorus, and arsenic, at least one of helium, neon, argon, krypton, and xenon, and hydrogen in appropriate combination can be added.

The addition of the dopant to the oxide semiconductor film 229 is conducted in a state where the oxide semiconductor film 229 is covered with the insulating film and the like; alternatively, the addition of the dopant may be conducted in a state where the oxide semiconductor film 229 is exposed.

Alternatively, the dopant can be added by a method other than an ion doping method, an ion implantation method, or the like. For example, the dopant can be added in the following manner: plasma is generated in an atmosphere of a gas containing an element to be added and plasma treatment is performed on an object to which the dopant is added. A dry etching apparatus, a plasma CVD apparatus, a high-density plasma CVD apparatus, or the like can be used to generate the plasma.

After that, heat treatment may be performed. The heat treatment is performed typically at a temperature of higher than or equal to 150° C. and lower than or equal to 450° C., preferably higher than or equal to 250° C. and lower than or equal to 325° C. In the heat treatment, the temperature may be gradually increased from 250° C. to 325° C.

Through the heat treatment, the resistance of the pair of second regions 235b and 235c containing the dopant can be reduced. In the heat treatment, the pair of second regions 235b and 235c containing the dopant may be in either a crystalline state or an amorphous state.

Figure 6C:
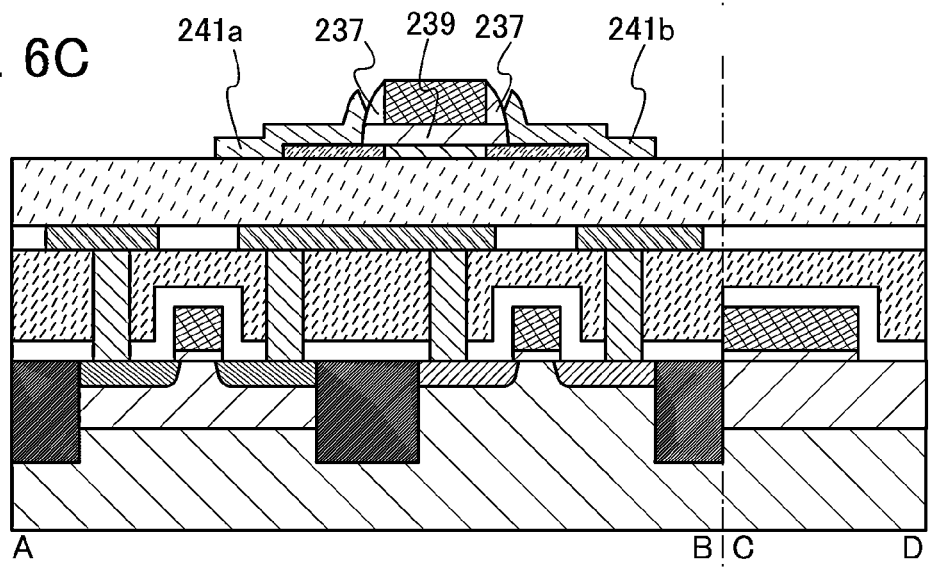

Next, as illustrated in FIG. 6C, sidewall insulating films 237 on side surfaces of the gate electrode 233, a gate insulating film 239, an electrode 241a, and an electrode 241b are formed.

The sidewall insulating films 237 may each be formed with a single layer or a stack using one or more of silicon oxide, silicon oxynitride, silicon nitride oxide, silicon nitride, aluminum oxide, aluminum oxynitride, aluminum nitride oxide, aluminum nitride, and the like, for example. The sidewall insulating films 237 may be formed using an oxide insulating film from which part of oxygen is released by heating in a manner similar to that of the insulating film 225.

The oxide insulating film from which part of oxygen is released by heating may be formed by adding oxygen after forming an oxide insulating film.

A method for forming the sidewall insulating films 237 is described below.

First, an insulating film to be the sidewall insulating films 237 is formed over the insulating film 231 and the gate electrode 233. The insulating film is formed by a sputtering method, a CVD method, or the like. In addition, although the thickness of the insulating film is not particularly limited, the thickness is selected as appropriate in consideration of coverage with respect to the shape of the gate electrode 233.

Then, the sidewall insulating films 237 are formed by etching the insulating film. The etching here is highly anisotropic etching, and the sidewall insulating films 237 can be formed in a self-aligned manner by performing the highly anisotropic etching on the insulating film.

The width of the region for relieving an electric field in each of the pair of second regions 235b and 235c containing the dopant depends on the width of the sidewall insulating films 237, and the width of the sidewall insulating films 237 is affected by the thickness of the gate electrode 233. Therefore, the thickness of the gate electrode 233 may be determined so that the width of the region for relieving an electric field has a desired value.

When the sidewall insulating films 237 are formed, the insulating film 231 is also etched by highly anisotropic etching and the oxide semiconductor film 235 is partly exposed, whereby the gate insulating film 239 is formed.

The pair of electrodes 241a and 241b can be formed using a material similar to that of the wirings 223a to 223c, as appropriate. Note that the pair of electrodes 241a and 241b may function as wirings.

The pair of electrodes 241a and 241b is formed by a printing method or an inkjet method. Alternatively, the pair of electrodes 241a and 241b is formed in such a manner that a conductive film is formed by a sputtering method, a CVD method, an evaporation method, or the like and then part of the conductive film is selectively etched.

The pair of electrodes 241a and 241b is preferably formed to be in contact with side surfaces of the sidewall insulating films 237 and the gate insulating film 239. In other words, it is preferable that end portions of the pair of electrodes 241a and 241b of the transistor be located over the sidewall insulating films 237 and that the pair of electrodes 241a and 241b cover exposed portions of the pair of second regions 235b and 235c containing the dopant in the oxide semiconductor film 235, entirely in the channel length direction. As a result, regions in the pair of second regions 235b and 235c containing the dopant, which are in contact with the pair of electrodes 241a and 241b, serve as a source region and a drain region, whereas regions in the pair of second regions 235b and 235c containing the dopant, which overlap with both the gate insulating film 239 and one of the sidewall insulating films 237, serve as electric-field relaxation regions. In addition, since the width of the electric-field relaxation regions can be controlled with the length of the sidewall insulating films 237, a high accuracy in alignment of a mask for forming the pair of electrodes 241a and 241b is not strictly required. Accordingly, variation among plural transistors can be reduced.

Note that the sidewall insulating films 237 are provided in contact with the side surfaces of the gate electrode 233 in this embodiment; however, the present invention is not limited to this structure, and the sidewall insulating films 237 are not necessarily provided. Although the sidewall insulating films 237 are formed after the pair of second regions 235b and 235c is formed in this embodiment, the present invention is not limited to this structure and the pair of second regions 235b and 235c may be formed after the sidewall insulating films 237 are formed.

Next, as illustrated in FIG. 7A, an insulating film 243 and an insulating film 245 are formed by a sputtering method, a CVD method, a coating method, a printing method, or the like.

The insulating films 243 and 245 may each be formed with a single layer or a stack including one or more of silicon oxide, silicon oxynitride, silicon nitride oxide, silicon nitride, aluminum oxide, aluminum oxynitride, aluminum nitride oxide, aluminum nitride, and the like. When the insulating film 245 is formed using an insulating film which prevents diffusion of oxygen to the outside, oxygen released from the insulating film 243 can be supplied to the oxide semiconductor film. Typical examples of an insulating film which prevents diffusion of oxygen to the outside include films of aluminum oxide, aluminum oxynitride, and the like. When an insulating film which prevents diffusion of hydrogen from the outside is used as the insulating film 245, diffusion of hydrogen from the outside to the oxide semiconductor film can be reduced, and defects in the oxide semiconductor film can be reduced. Typical examples of the insulating film which prevents diffusion of hydrogen from the outside include films of silicon nitride, silicon nitride oxide, aluminum nitride, aluminum nitride oxide, and the like. Further, when the insulating film 243 has a three-layer structure of an oxide insulating film from which part of oxygen is released by heating, an insulating film which prevents diffusion of oxygen to the outside, and an oxide insulating film, oxygen can be efficiently diffused to the oxide semiconductor film and oxygen can be prevented from being released to the outside; accordingly, variation in transistor characteristics can be reduced even at high temperature and in high humidity.

Through the above steps, as illustrated in FIG. 7A, the transistor 111 including an oxide semiconductor film can be manufactured. Note that the transistor 111 has a channel portion in the oxide semiconductor film 235 which is i-type (intrinsic) or substantially i-type, and therefore exhibits excellent characteristics.

Although the transistor 111 of this embodiment has a top-gate structure, the present invention is not limited to the top-gate structure and a bottom-gate structure may be employed. Further, in the transistor 111 of this embodiment, the pair of electrodes 241a and 241b is in contact with at least part of upper surfaces of the pair of second regions 235b and 235c; however, the present invention is not limited to this structure.

Next, part of each of the insulating film 215, the insulating film 217, the insulating film 221, the insulating film 225, the insulating film 243, and the insulating film 245 is selectively etched, so that opening portions are formed to expose part of each of the gate electrode 209a, the electrode 241a, and the electrode 241b. After a conductive film is formed in the opening portions, part of the conductive film is selectively etched; thus, a wiring 249 and a wiring 250 are formed. The wiring 249 and the wiring 250 can be formed using the same material as that of the contact plugs 219a to 219d as appropriate.

Here, the wiring 249 serves as the node N which electrically connects the one of the source electrode and the drain electrode (the electrode 241a) of the transistor 111 and the gate electrode 209a of the transistor 107. Although not directly illustrated in FIG. 7B, the wiring 249 is also electrically connected to the gate electrode 209b of the transistor 106. The wiring 250 serves as the other of the source electrode and the drain electrode (the electrode 241b) of the transistor 111 and is electrically connected to the signal line S3 illustrated in FIG. 3. Further, although not directly illustrated in FIG. 7B, the gate electrode 233 of the transistor 111 is electrically connected to the signal line S5 illustrated in FIG. 3.

Through the above steps, the logic circuit including the transistor 111, the transistor 107, and the transistor 106 can be manufactured.

As described above, with the use of a wide bandgap semiconductor such as an oxide semiconductor, the off-state current of a transistor can be sufficiently reduced. In addition, with the use of the transistor as a transistor for switching a charge holding state at the node N, a logic circuit capable of keeping a charge holding state at the node N even when a power supply potential is not supplied can be manufactured. In other words, the transistor formed using an oxide semiconductor functions as a nonvolatile memory by switching of the charge holding state at the node N. Furthermore, a logic circuit having short start-up time of a logic block after the power is supplied can be manufactured. Accordingly, a reduction in power consumption of a programmable logic device can be achieved by a normally-off driving method.

By the way, a magnetic tunnel junction element (an MTJ element) is known as a nonvolatile random access memory. The MTJ element stores data in a low resistance state when the spin directions in films provided above and below an insulating film are parallel, and stores data in a high resistance state when the spin directions are anti-parallel. Therefore, the principles of the MTJ element and the memory including the transistor formed using an oxide semiconductor in this embodiment are completely different from each other. Table 3 shows comparison between the MTJ element and the semiconductor device of this embodiment.

TABLE 3

| | Spintronics (MTJ element) | OS/Si |
|---|---|---|
| Heat Resistance | Curie temperature | Process temperature at 500° C. (reliability at 150° C.) |
| Driving Method | Current driving | Voltage driving |
| Writing Principle | Changing spin direction of magnetic body | Turning on/off FET |
| Si LSI | Suitable for bipolar LSI (MOS LSI is preferable for high integration because bipolar LSI is unsuitable for high integration. Note that W becomes larger.) | Suitable for MOS LSI |
| Overhead | Large (because of high Joule heat) | Smaller than overhead of the MTJ element by 2 to 3 or more orders of magnitude (because of charging and discharging of parasitic capacitance) |

TABLE 3-continued

| | Spintronics (MTJ element) | OS/Si |
|---|---|---|
| Nonvolatility | Utilizing spin | Utilizing low off-state current |
| Read Number | Without limitation | Without limitation |
| 3D Conversion | Difficult (at most two layers) | Easy (the number of layers is limitless) |
| Integration Degree ($F^2$) | 4 to 15 $F^2$ | Depends on the number of layers stacked in 3D conversion (it is necessary to ensure heat resistance in process of forming upper OS FET) |
| Material Cost per Bit | Magnetic rare-earth element High | OS material Low (might be slightly high depending on OS material) |
| Resistance to Magnetic Field | Low | High |

The MTJ element is disadvantageous in that magnetic properties are lost when the temperature is the Curie temperature or higher because a magnetic material is used. Further, the MTJ element is compatible with a silicon bipolar device because current drive is employed. However, a silicon bipolar device is unsuitable for high integration. Furthermore, the MTJ element has a problem in that power consumption is increased by an increase in memory capacity, though the MTJ element consumes an extremely small amount of current during data writing.

In principle, the MTJ element has low resistance to a magnetic field, so that the spin direction is likely to change when the MTJ element is exposed to a high magnetic field. Further, it is necessary to control magnetic fluctuation due to nanoscaling of a magnetic body used for the MTJ element.

In addition, a rare earth element is used for the MTJ element; thus, it requires special attention to incorporate a process of forming the MTJ element in a process for a silicon semiconductor that is sensitive to metal contamination. Further, the material cost per bit of the MTJ element is expensive.

On the other hand, the transistor including an oxide semiconductor in this embodiment has an element structure and an operation principle which are similar to those of a silicon MOSFET except that the region in which the channel is formed includes a metal oxide. Further, the transistor including an oxide semiconductor is not affected by a magnetic field, and does not cause soft errors. This shows that the transistor is highly compatible with a silicon integrated circuit.

The structures, the methods, and the like in this embodiment can combined with each other, or can also be combined with any of structures, methods, and the like in the other embodiments as appropriate.

Embodiment 3

In this embodiment, the field-effect mobility of the transistor including an oxide semiconductor film, which is described in the above embodiments, is theoretically calculated, and the transistor characteristics are calculated from the field-effect mobility.

The actually measured field-effect mobility of an insulated gate transistor can be lower than its ideal mobility because of a variety of reasons; this phenomenon occurs not only in the case of using an oxide semiconductor. One of the causes for the lower mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the ideal mobility and the measured field-effect mobility of a semiconductor are $\mu_0$ and $\mu$, respectively, and a potential barrier (such as a grain boundary) exists in the semiconductor, the measured field-effect mobility can be expressed by the following formula (2).

[Formula 2]

$$\mu = \mu_0 \exp\left(-\frac{E}{kT}\right) \quad (2)$$

Here, E represents the height of the potential barrier, k represents the Boltzmann constant, and T represents the absolute temperature. When the potential barrier is assumed to be attributed to a defect, the height of the potential barrier can be expressed by the following formula (3) according to the Levinson model.

[Formula 3]

$$E = \frac{e^2 N^2}{8\varepsilon n} = \frac{e^2 N^2 t}{8\varepsilon\, C_{ox} V_g} \quad (3)$$

Here, e represents the elementary charge, N represents the average defect density per unit area in a channel, c represents the permittivity of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor layer is less than or equal to 30 nm, the thickness of the channel may be regarded as being the same as the thickness of the semiconductor layer. The drain current $I_d$ in a linear region can be expressed by the following formula (4).

[Formula 4]

$$I_d = \frac{W\mu V_g V_d C_{ox}}{L}\exp\left(-\frac{E}{kT}\right) \quad (4)$$

Here, L represents the channel length and W represents the channel width, and L and W are each 10 μm in this case. In addition, $V_d$ represents the drain voltage. When dividing both sides of the formula (4) by $V_g$ and then taking logarithms of both sides, the following formula (5) can be obtained.

[Formula 5]

$$\ln\left(\frac{I_d}{V_g}\right) = \ln\left(\frac{W\mu V_d C_{ox}}{L}\right) - \frac{E}{kT} = \ln\left(\frac{W\mu V_d C_{ox}}{L}\right) - \frac{e^3 N^2 t}{8kt\,\varepsilon\,C_{ox}V_g} \quad (5)$$

The right side of the formula (5) is a function of $V_g$. From the formula, it is found that the defect density N can be obtained from the slope of a line in which $\ln(I_d/V_g)$ is the ordinate and $1/V_g$ is the abscissa. That is, the defect density can be evaluated from the $I_d$-$V_g$ characteristics of the transistor. The defect density N of an oxide semiconductor in which the ratio of indium (In) to tin (Sn) and zinc (Zn) is 1:1:1 is approximately $1\times10^{12}$ cm$^{-2}$.

On the basis of the defect density obtained in this manner, or the like, $\mu_0$ can be calculated to be 120 cm$^2$/Vs from the formula (2) and the formula (3). The measured mobility of an In—Sn—Zn oxide including a defect is approximately 40 cm$^2$/Vs. However, assuming that no defect exists inside the semiconductor and at the interface between the semiconductor and an insulating film, the mobility to of the oxide semiconductor is expected to be 120 cm$^2$/Vs.

Note that even when no defect exists inside a semiconductor, scattering at an interface between a channel and a gate insulator affects the transport property of the transistor. In other words, the mobility $\mu_1$ at a position that is distance x away from the interface between the channel and the gate insulator can be expressed by the following formula (6).

[Formula 6]

$$\frac{1}{\mu_1} = \frac{1}{\mu_0} + \frac{D}{B}\exp\left(-\frac{x}{l}\right) \quad (6)$$

Here, D represents the electric field in the gate direction, and B and l are constants. B and l can be obtained from actual measurement results; according to the above measurement results, B is $4.75\times10^7$ cm/s and l is 10 nm (the depth to which the influence of interface scattering reaches). When D is increased (i.e., when the gate voltage is increased), the second term of the formula (6) is increased and accordingly the mobility $\mu_1$ is decreased.

Figure 13:
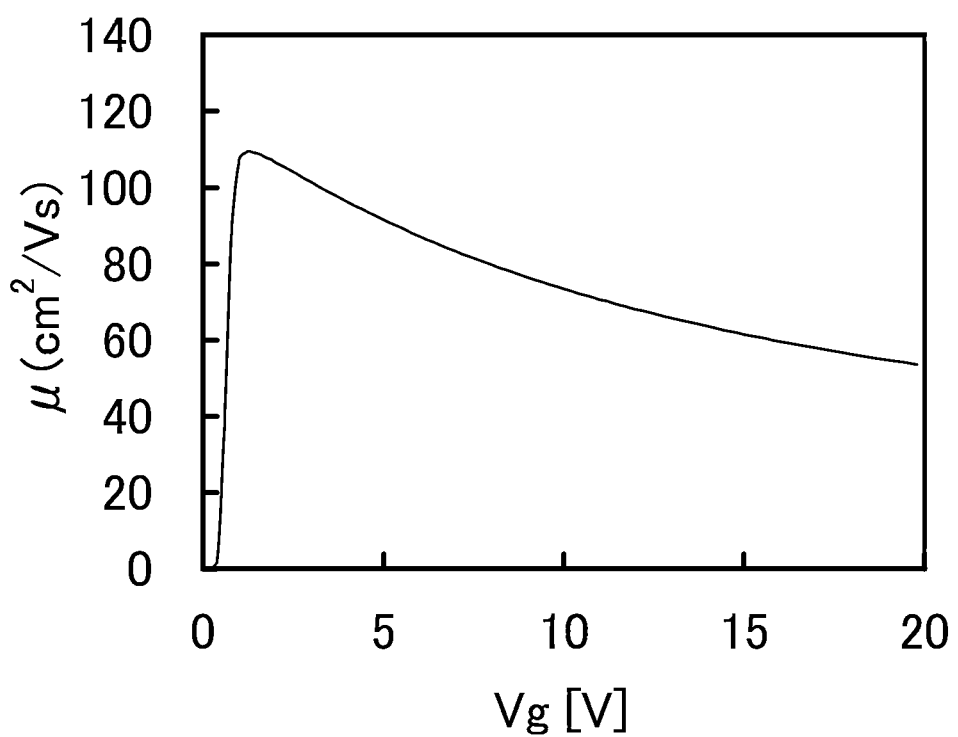
FIG. 13 shows gate voltage dependence of mobility obtained by calculation.

FIG. 13 shows calculation results of the mobility μ of a transistor whose channel is formed using an ideal oxide semiconductor without a defect inside the semiconductor. For the calculation, device simulation software Sentaurus Device manufactured by Synopsys, Inc. was used, and the band gap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulator was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 13, the mobility has a peak of 100 cm$^2$/Vs or more at a gate voltage that is a little over 1 V, and is decreased as the gate voltage becomes higher because the influence of interface scattering is increased. Note that in order to reduce interface scattering, it is desirable that a surface of the semiconductor layer be flat at the atomic level (atomic layer flatness (ALF)).

Calculation results of characteristics of minute transistors formed using an oxide semiconductor having such a mobility are shown in FIGS. 14A to 14C, FIGS. 15A to 15C, and FIGS. 16A to 16C. FIGS. 17A and 17B illustrate cross-sectional structures of the transistors used for the calculation. The transistors illustrated in FIGS. 17A and 17B each include a second region 1103b and a second region 1103c that have n$^+$-type conductivity in an oxide semiconductor layer. The resistivity of the second regions 1103b and 1103c is $2\times10^{-3}$ Ωcm.

The transistor in FIG. 17A is formed over a base insulating film 1101 and an embedded insulator 1102 that is embedded in the base insulating film 1101 and formed of aluminum oxide. The transistor includes the second region 1103b, the second region 1103c, an intrinsic first region 1103a that is placed between the second regions 1103b and 1103c and serves as a channel formation region, and a gate electrode 1105. The width of the gate electrode 1105 (i.e., corresponding to the channel length) is 33 nm.

A gate insulating film 1104 is formed between the gate electrode 1105 and the first region 1103a. A sidewall insulating film 1106a and a sidewall insulating film 1106b are formed on side surfaces of the gate electrode 1105, and an insulator 1107 is formed over the gate electrode 1105 so as to prevent a short circuit between the gate electrode 1105 and another wiring. The sidewall insulating films each have a width of 5 nm. A source electrode 1108a and a drain electrode 1108b are provided in contact with the second region 1103b and the second region 1103c, respectively. Note that the channel width of this transistor is 40 nm.

The transistor in FIG. 17B is the same as the transistor in FIG. 17A in that it is formed over the base insulating film 1101 and the embedded insulator 1102 formed of aluminum oxide and that it includes the second region 1103b, the second region 1103c, the intrinsic first region 1103a provided therebetween, the gate electrode 1105 having a width of 33 nm, the gate insulating film 1104, the sidewall insulating film 1106a, the sidewall insulating film 1106b, the insulator 1107, the source electrode 1108a, and the drain electrode 1108b.

The difference between the transistor in FIG. 17A and the transistor in FIG. 17B is the conductivity type of semiconductor regions under the sidewall insulating films 1106a and 1106b. In the transistor in FIG. 17A, the semiconductor regions under the sidewall insulating film 1106a and the sidewall insulating film 1106b are part of the second region 1103b having n$^+$-type conductivity and part of the second region 1103c having n$^+$-type conductivity, whereas in the transistor in FIG. 17B, the semiconductor regions under the sidewall insulating film 1106a and the sidewall insulating film 1106b are part of the intrinsic first region 1103a. In other words, in the semiconductor layer of FIG. 17B, a region which overlaps with neither the second region 1103b (the second region 1103c) nor the gate electrode 1105 is provided. This region is called an offset region and has a width Loff called an offset length. As is seen from the drawing, the offset length is equal to the width of the sidewall insulating film 1106a (the sidewall insulating film 1106b).

Figure 14A:
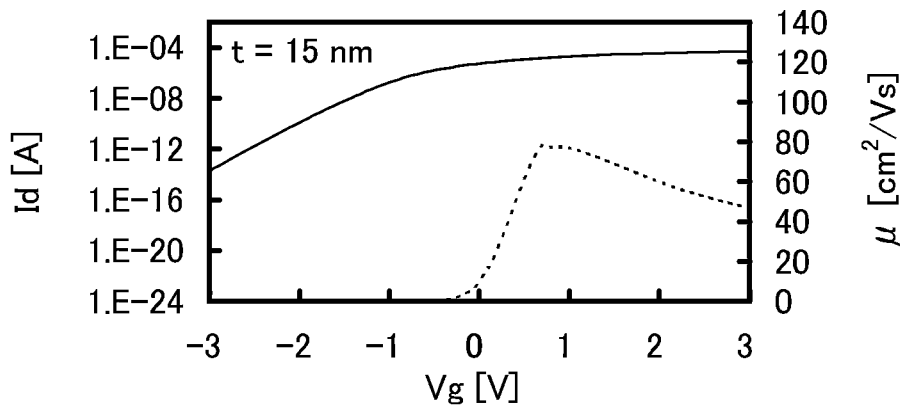
FIGS. 14A to 14C show gate voltage dependence of drain current and mobility obtained by calculation.
Figure 14B:
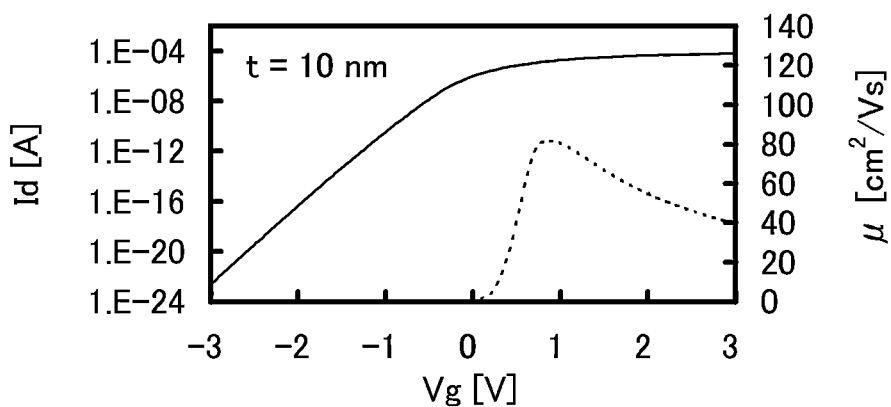
Figure 14C:
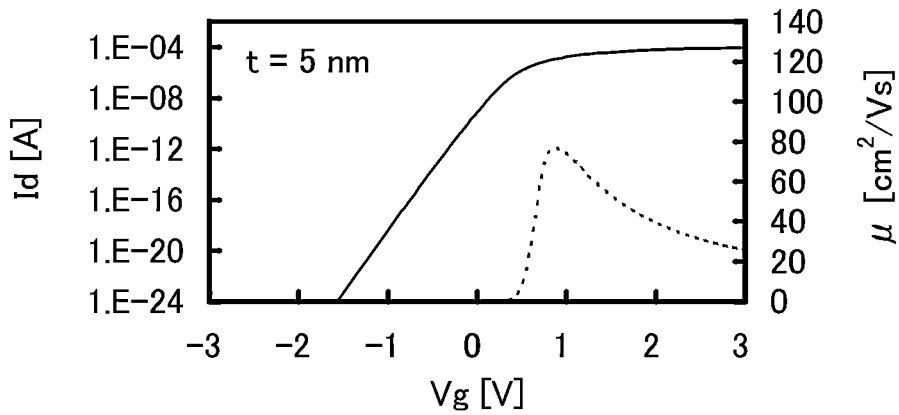

The other parameters used in calculation are as described above. For the calculation, device simulation software Sentaurus Device manufactured by Synopsys, Inc. was used. FIGS. 14A to 14C show the gate voltage $V_g$ (a potential difference between the gate and the source) dependence of the drain current $I_d$ (a solid line) and the mobility (a dotted line) of the transistor having the structure illustrated in FIG. 17A. The drain current $I_d$ is obtained by calculation under the assumption that the drain voltage (a potential difference between the drain and the source) is +1 V, and the mobility g is obtained by calculation under the assumption that the drain voltage is +0.1 V.

FIG. 14A shows the gate voltage dependence of the transistor in the case where the thickness of the gate insulating film is 15 nm, FIG. 14B shows that of the transistor in the case where the thickness of the gate insulating film is 10 nm, and FIG. 14C shows that of the transistor in the case where the thickness of the gate insulating film is 5 nm. As the gate insulating film is thinner, the drain current $I_d$ in an off state (the off-state current) in particular is significantly decreased. In contrast, there is no noticeable change in peak value of the mobility μ and the drain current $I_d$ in an on state (the on-state current). The graphs show that the drain current exceeds 10 μA, which is required in a memory element and the like, at a gate voltage of around 1 V.

Figure 15A:
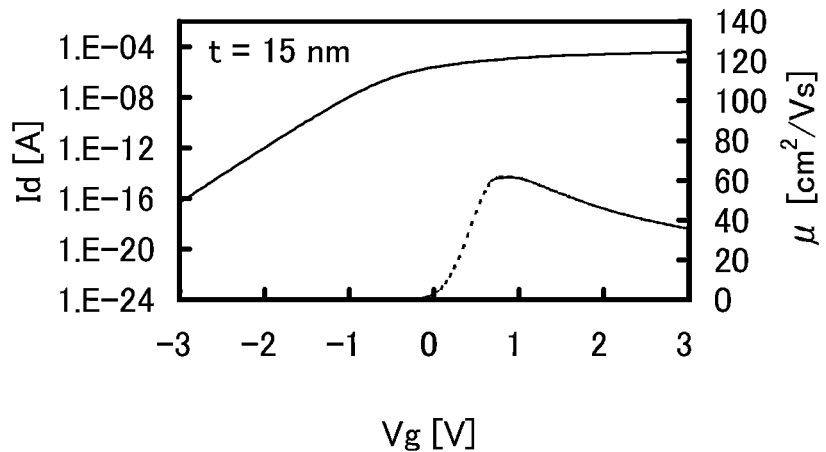
FIGS. 15A to 15C show gate voltage dependence of drain current and mobility obtained by calculation.
Figure 15B:
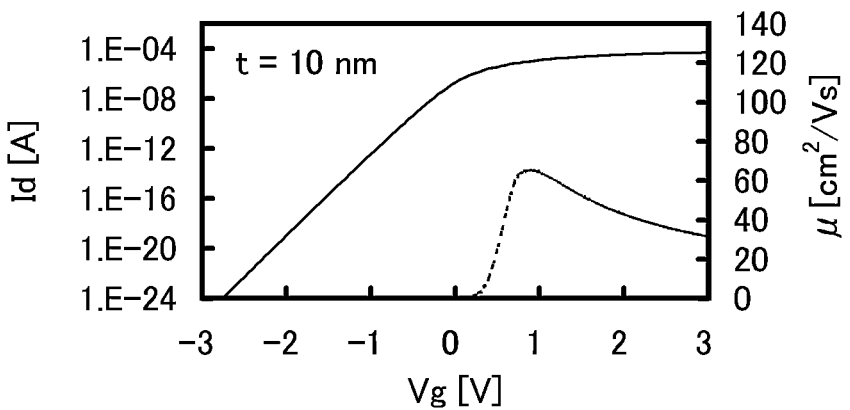
Figure 15C:
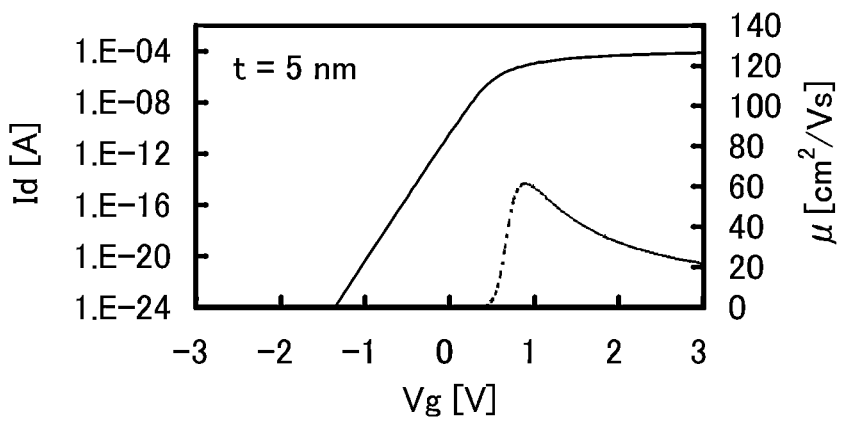

FIGS. 15A to 15C show the gate voltage $V_g$ dependence of the drain current $I_d$ (a solid line) and the mobility μ (a dotted line) of the transistor having the structure in FIG. 17B and an offset length Loff of 5 nm. The drain current $I_d$ is obtained by calculation under the assumption that the drain voltage is +1 V, and the mobility g is obtained by calculation under the assumption that the drain voltage is +0.1 V. FIG. 15A shows the gate voltage dependence of the transistor in the case where the thickness of the gate insulating film is 15 nm, FIG. 15B shows that of the transistor in the case where the thickness of the gate insulating film is 10 nm, and FIG. 15C shows that of the transistor in the case where the thickness of the gate insulating film is 5 nm.

Figure 16A:
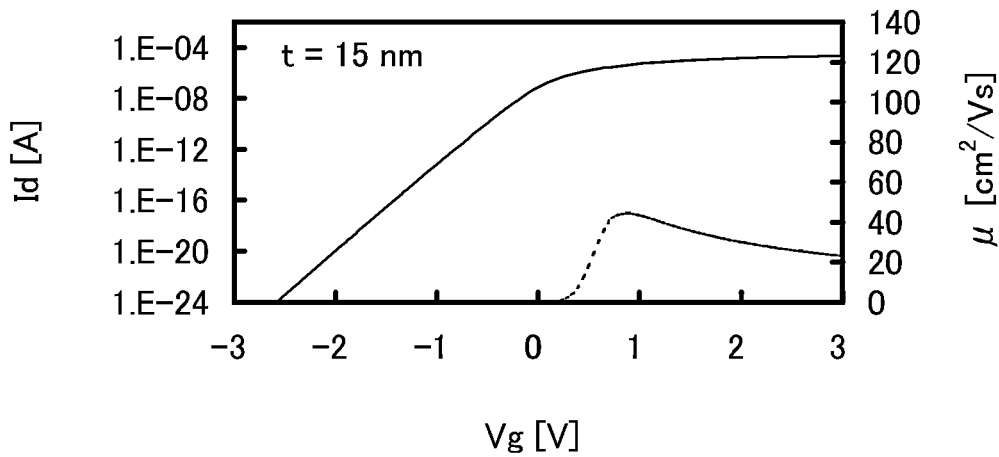
FIGS. 16A to 16C show gate voltage dependence of drain current and mobility obtained by calculation.
Figure 16B:
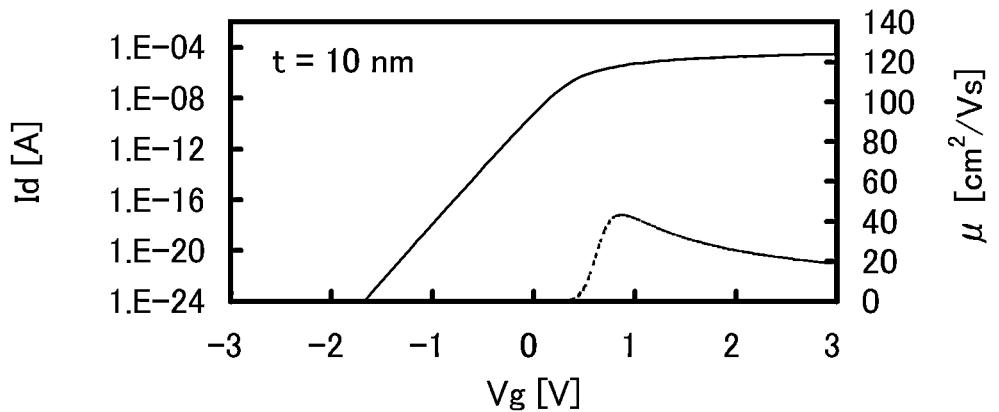
Figure 16C:
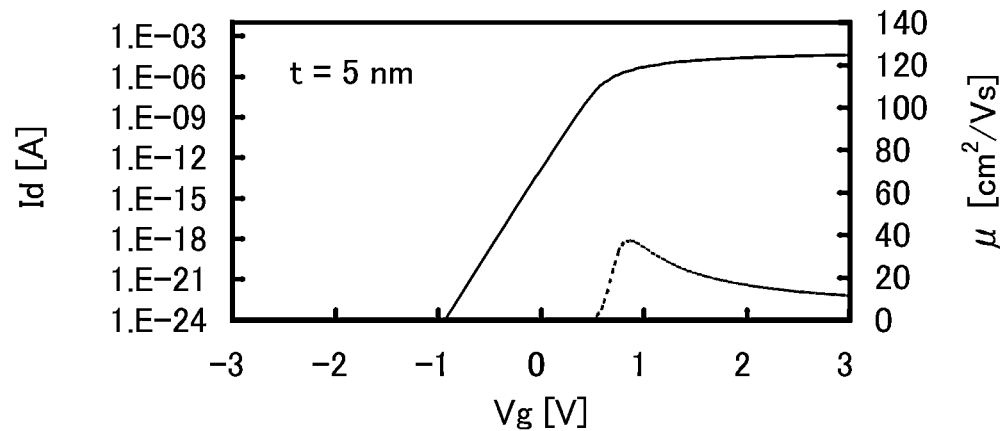
Figure 17A:
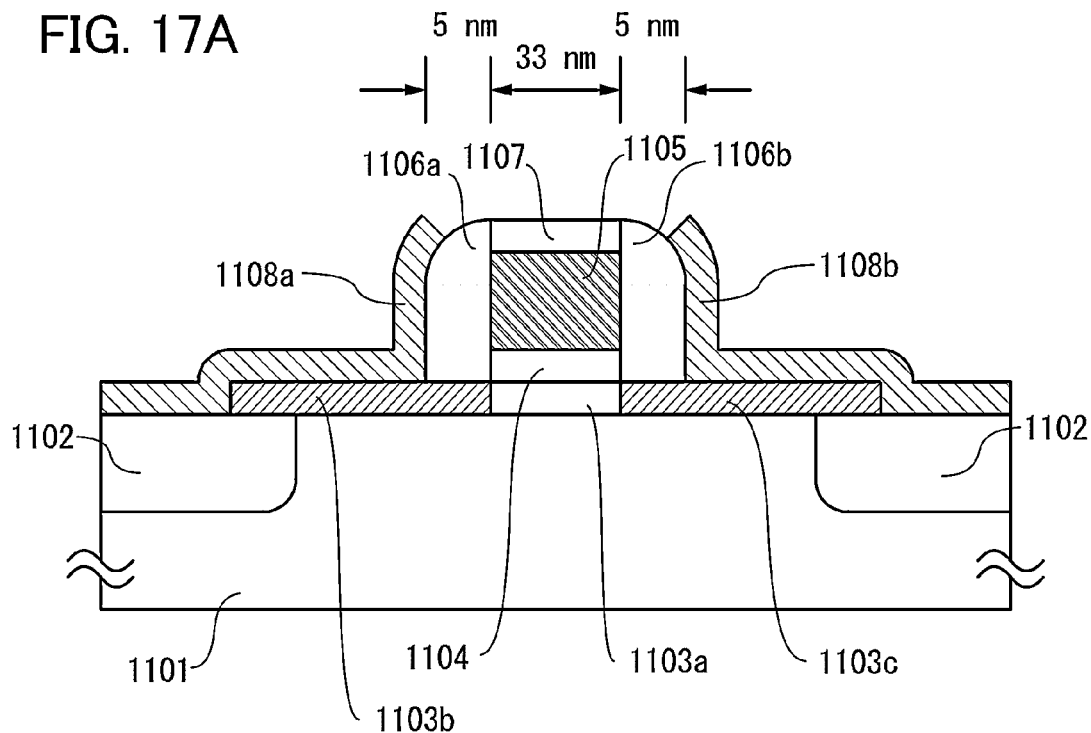
FIGS. 17A and 17B illustrate cross-sectional structures of transistors used for calculation.
Figure 17B:
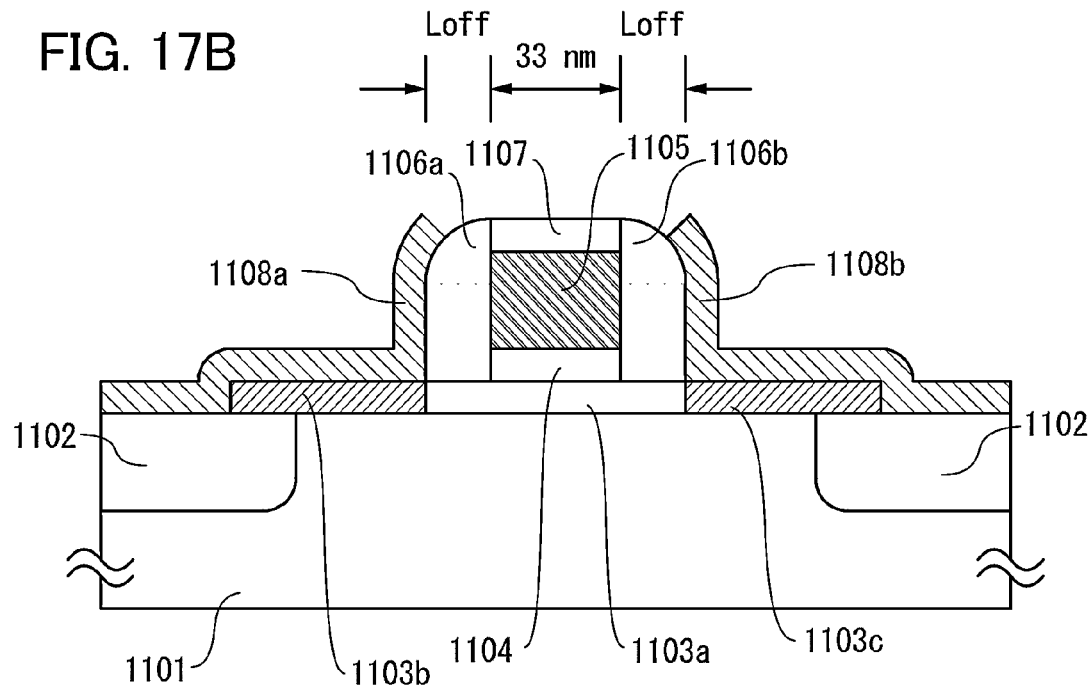

FIGS. 16A to 16C show the gate voltage dependence of the drain current $I_d$ (a solid line) and the mobility μ (a dotted line) of the transistor having the structure in FIG. 17B and an offset length Loff of 15 nm. The drain current $I_d$ is obtained by calculation under the assumption that the drain voltage is +1 V, and the mobility g is obtained by calculation under the assumption that the drain voltage is +0.1 V. FIG. 16A shows the gate voltage dependence of the transistor in the case where the thickness of the gate insulating film is 15 nm, FIG. 16B shows that of the transistor in the case where the thickness of the gate insulating film is 10 nm, and FIG. 16C shows that of the transistor in the case where the thickness of the gate insulating film is 5 nm.

In either of the structures, as the gate insulating film is thinner, the off-state current is significantly decreased, whereas no noticeable change arises in the peak value of the mobility μ and the on-state current.

Note that the peak of the mobility μ is approximately 80 cm$^2$/Vs in FIGS. 14A to 14C, approximately 60 cm$^2$/Vs in FIGS. 15A to 15C, and approximately 40 cm$^2$/Vs in FIGS. 16A to 16C; thus, the peak of the mobility μ is decreased as the offset length Loff is increased. Further, the same applies to the off-state current. The on-state current is also decreased as the offset length Loff is increased; however, the decrease in the on-state current is much more gradual than the decrease in the off-state current. Further, the graphs show that in either of the structures, the drain current exceeds 10 μA, which is required in a memory element and the like, at a gate voltage of around 1 V. Thus, when the transistor having high mobility is used as a transistor for switching the logic circuit described in the above embodiments, writing to the node N can be performed at high speed; therefore, a programmable logic device in which dynamic configuration can be performed easily can be provided.

Embodiment 4

In this embodiment, as the transistor including the oxide semiconductor film, which is described in the above embodiments, a transistor including an oxide semiconductor film which contains In, Sn, and Zn as its main components will be particularly described.

A transistor in which an oxide semiconductor containing In, Sn, and Zn as main components is used as a channel formation region can have favorable characteristics by depositing the oxide semiconductor while heating a substrate or by performing heat treatment after forming an oxide semiconductor film. Note that a main component refers to an element included in a composition at 5 atomic % or more.

By intentionally heating the substrate after formation of the oxide semiconductor film containing In, Sn, and Zn as main components, the field-effect mobility of the transistor can be improved. Further, the threshold voltage of the transistor can be positively shifted to make the transistor normally off. Hereinafter, results of various measurements of the transistor including the oxide semiconductor film containing In, Sn, and Zn as main components will be described.

Figure 23A:
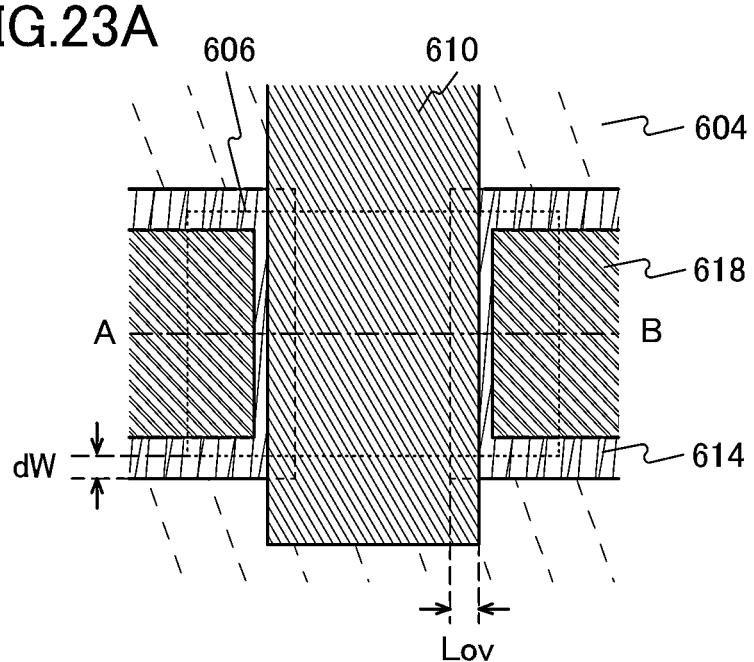
FIGS. 23A and 23B are a top view and a cross-sectional view of a transistor used for measurement.

First, a structure of the transistor used for the various measurements in this embodiment will be described with reference to FIGS. 23A and 23B. FIG. 23A is a plan view of the transistor, and FIG. 23B is a cross-sectional view taken along dashed-dotted line A-B in FIG. 23A.

Figure 23B:
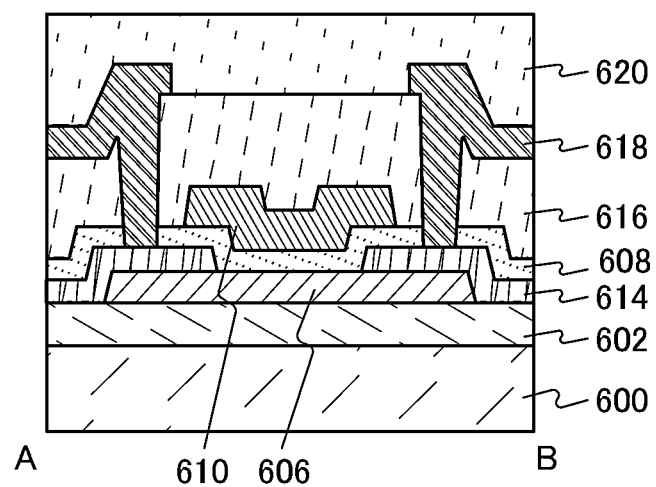

The transistor illustrated in FIG. 23B includes a substrate 600; a base insulating film 602 provided over the substrate 600; an oxide semiconductor film 606 provided over the base insulating film 602; a pair of electrodes 614 in contact with the oxide semiconductor film 606; a gate insulating film 608 provided over the oxide semiconductor film 606 and the pair of electrodes 614; a gate electrode 610 provided to overlap with the oxide semiconductor film 606 with the gate insulating film 608 positioned therebetween; an interlayer insulating film 616 provided to cover the gate insulating film 608 and the gate electrode 610; wirings 618 electrically connected to the pair of electrodes 614 through openings formed in the gate insulating film 608 and the interlayer insulating film 616; and a protective film 620 provided to cover the interlayer insulating film 616 and the wirings 618. The pair of electrodes 614 functions as a source electrode and a drain electrode of the transistor.

As the substrate 600, a glass substrate was used. As the base insulating film 602, a silicon oxide film was used. As the oxide semiconductor film 606, an In—Sn—Zn—O film was used. As the pair of electrodes 614, a tungsten film was used. As the gate insulating film 608, a silicon oxide film was used. The gate electrode 610 had a layered structure of a tantalum nitride film and a tungsten film. The interlayer insulating film 616 had a layered structure of a silicon oxynitride film and a polyimide film. The wirings 618 each had a layered structure in which a titanium film, an aluminum film, and a titanium film were formed in this order. As the protective film 620, a polyimide film was used.

Note that in the transistor having the structure illustrated in FIG. 23A, the width of a portion where the gate electrode 610 overlaps with one of the pair of electrodes 614 is referred to as Lov. Similarly, the width of a portion of the pair of electrodes 614, which does not overlap with the oxide semiconductor film 606, is referred to as dW.

Figure 18A:
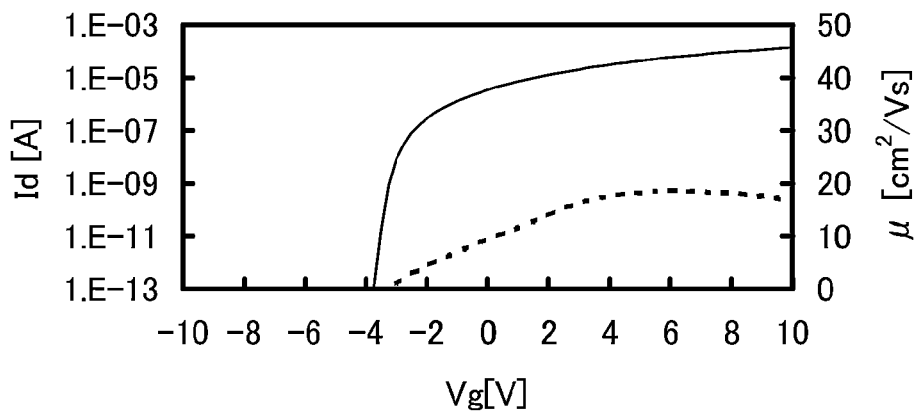
FIGS. 18A to 18C show characteristics of a transistor formed using an oxide semiconductor film.
Figure 18B:
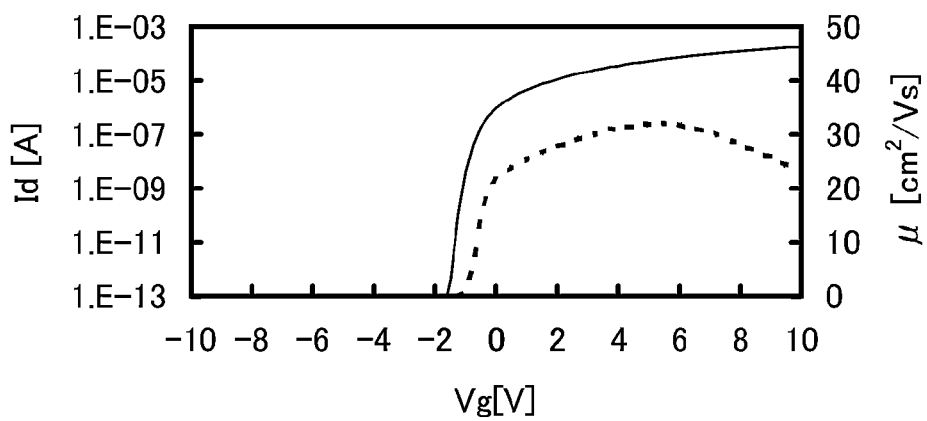
Figure 18C:
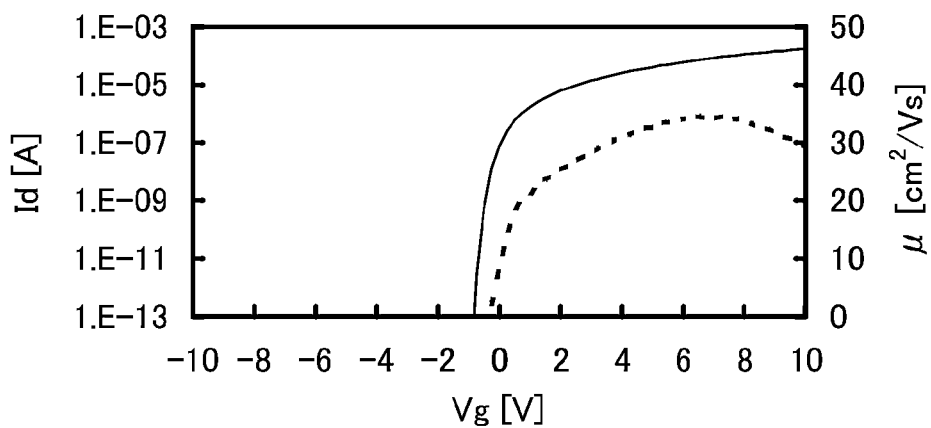

FIGS. 18A to 18C show the characteristics (gate voltage dependence of drain current $I_d$ (a solid line) and mobility μ (a dotted line)) of the transistor in FIGS. 23A and 23B, which includes an oxide semiconductor film having a channel length L of 3 μm and a channel width W of 10 μm and a gate insulating film having a thickness of 100 nm. Note that $V_d$ was set to 10 V.

FIG. 18A is a graph showing characteristics of a transistor whose oxide semiconductor film containing In, Sn, and Zn as main components is formed by a sputtering method without heating a substrate intentionally. The field-effect mobility of the transistor is 18.8 cm$^2$/Vs. On the other hand, when the oxide semiconductor film containing In, Sn, and Zn as main components is formed while the substrate is intentionally heated, the field-effect mobility can be improved. FIG. 18B shows characteristics of a transistor whose oxide semiconductor film containing In, Sn, and Zn as main components is formed while a substrate is heated at 200° C. The field-effect mobility of the transistor is 32.2 cm$^2$/Vs.

The field-effect mobility can be further improved by performing heat treatment after formation of the oxide semiconductor film containing In, Sn, and Zn as main components. FIG. 18C shows characteristics of a transistor whose oxide semiconductor film containing In, Sn, and Zn as main components is formed by sputtering at 200° C. and then subjected to heat treatment at 650° C. The field-effect mobility of the transistor is 34.5 cm$^2$/Vs.

The intentional heating of the substrate is expected to have an effect of reducing moisture taken into the oxide semiconductor film during the formation by sputtering. Further, the heat treatment after film formation enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. In addition, the oxide semiconductor can be crystallized by being highly purified by removal of impurities from the oxide semiconductor. In the case of using such a highly purified non-single-crystal oxide semiconductor, ideally, a field-effect mobility exceeding 100 cm$^2$/Vs is expected to be realized.

The oxide semiconductor containing In, Sn, and Zn as main components may be crystallized in the following manner: oxygen ions are implanted into the oxide semiconductor, hydrogen, a hydroxyl group, or moisture included in the oxide semiconductor is released by heat treatment, and the oxide semiconductor is crystallized through the heat treatment or by another heat treatment performed later. By such crystallization treatment or recrystallization treatment, a non-single-crystal oxide semiconductor having favorable crystallinity can be obtained.

The intentional heating of the substrate during film formation and the heat treatment after the film formation contribute not only to improving field-effect mobility but also to making the transistor normally off. In a transistor in which an oxide semiconductor film which contains In, Sn, and Zn as main components and is formed without heating a substrate intentionally is used as a channel formation region, the threshold voltage tends to be shifted negatively. However, when the oxide semiconductor film formed while the substrate is intentionally heated is used, the problem of the negative shift of the threshold voltage can be solved. That is, the threshold voltage is shifted so that the transistor becomes normally off; this tendency can be confirmed by comparison between FIGS. 18A and 18B.

Note that the threshold voltage can also be controlled by changing the ratio of In to Sn and Zn; when the composition ratio of In to Sn and Zn is 2:1:3, a normally-off transistor is expected to be formed. In addition, an oxide semiconductor film having high crystallinity can be achieved by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When film formation or heat treatment is performed at high temperature, the transistor can be normally off.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby the effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen deficiency is easily caused in the oxide semiconductor or at an interface between the oxide semiconductor and a stacked film; however, when excess oxygen is included in the oxide semiconductor by the heat treatment, oxygen deficiency caused constantly can be compensated for with excess oxygen. The excess oxygen is mainly oxygen existing between lattices. When the concentration of oxygen is set higher than or equal to $1\times10^{16}$ cm$^{-3}$ and lower than or equal to $2\times10^{20}$ cm$^{-3}$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film which is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed with X-ray diffraction.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target having an atomic ratio of In:Sn:Zn=1:1:1 was used as a target. Note that the substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was performed first for one hour and heat treatment in an oxygen atmosphere was further performed for one hour without lowering the temperature. A sample manufactured in this manner was used as Sample B.

Figure 19:
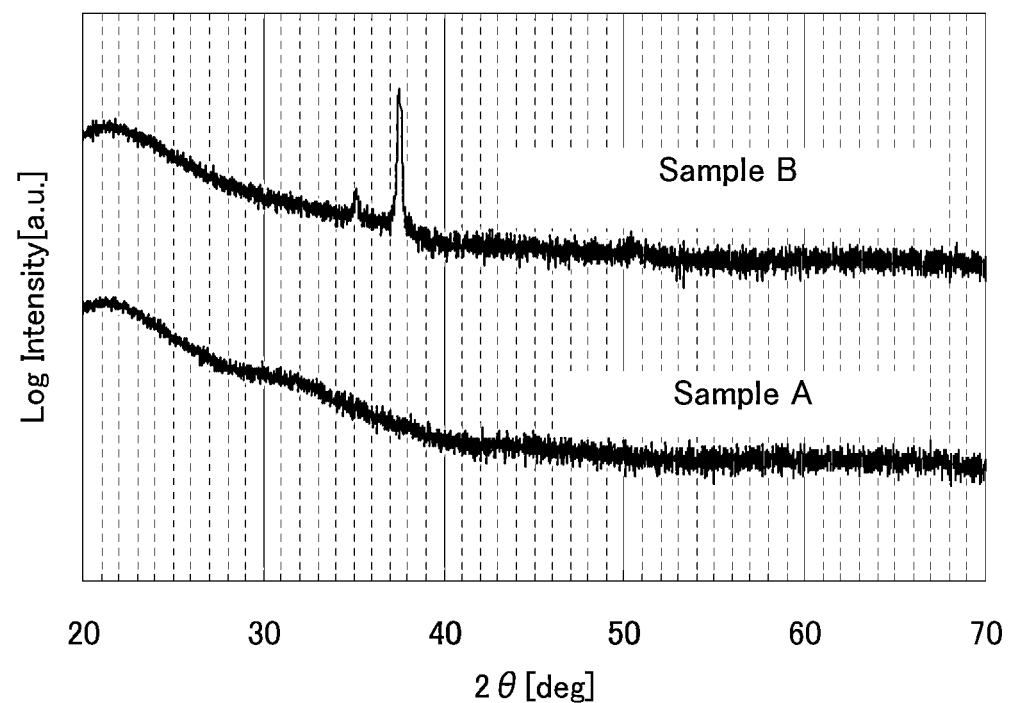
FIG. 19 shows XRD spectra of Sample A and Sample B.

FIG. 19 shows XRD spectra of Sample A and Sample B. No peak derived from crystal was observed in Sample A, whereas peaks derived from crystal were observed when 2θ was around 35 deg. and at 37 deg. to 38 deg. in Sample B.

As described above, by intentionally heating a substrate during deposition of an oxide semiconductor containing In, Sn, and Zn as main components and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be highly purified by removing hydrogen serving as a donor impurity from the oxide semiconductor, whereby a normally-off transistor can be obtained. The high purification of an oxide semiconductor enables the off-state current of the transistor to be 1 aA/μm or smaller. Here, the unit of the off-state current represents current per micrometer of a channel width.

Figure 20:
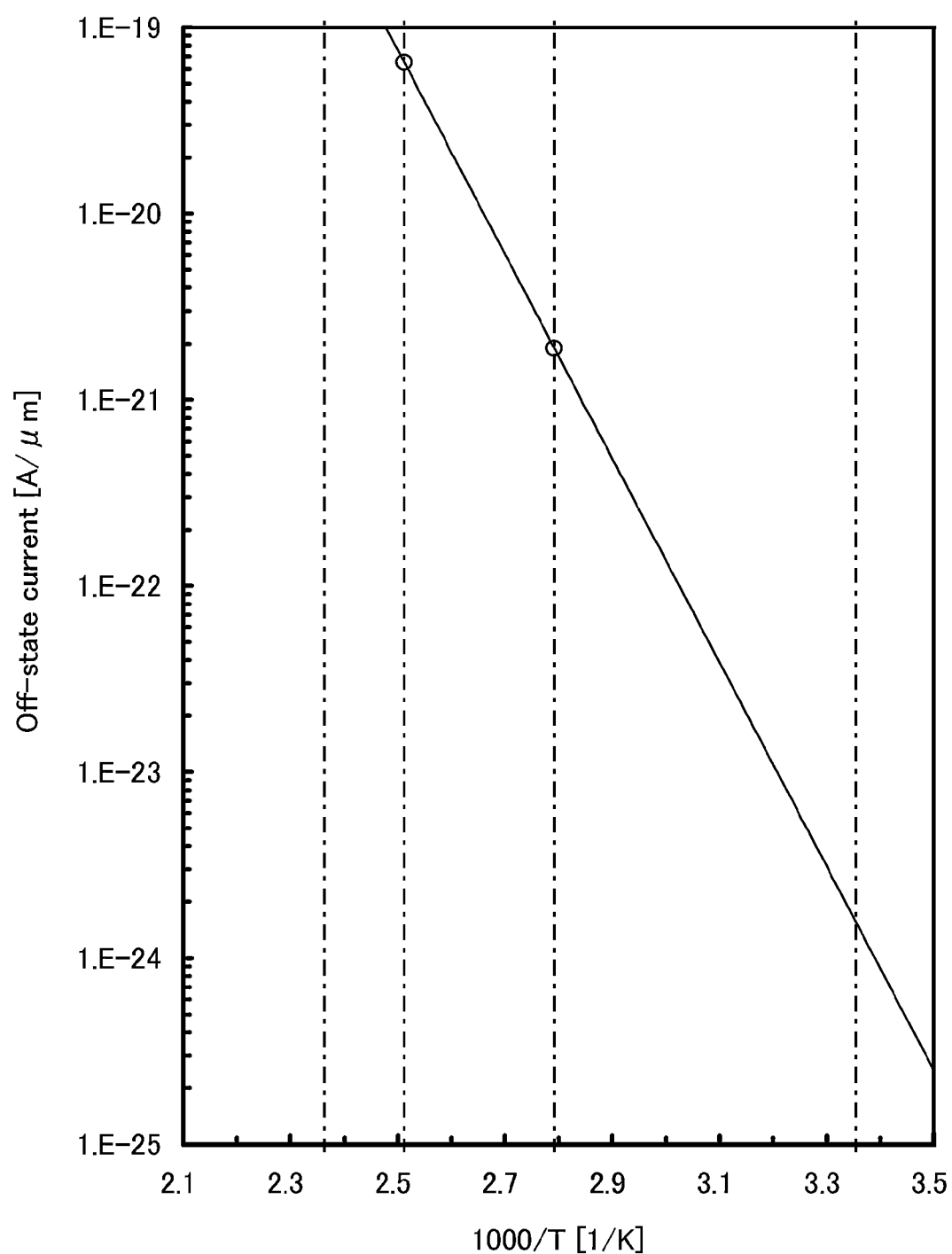
FIG. 20 shows a relation between off-state current of a transistor and substrate temperature in measurement.

FIG. 20 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000.

Specifically, as shown in FIG. 20, the off-state current was 0.1 aA/μm ($1\times10^{-19}$ A/μm) or smaller and 10 zA/μm ($1\times10^{-20}$ A/μm) or smaller when the substrate temperature was 125° C. and 85° C., respectively. The proportional relation between the logarithm of the off-state current and the inverse of the temperature suggests that the off-state current at room temperature (27° C.) is 0.1 zA/μm ($1\times10^{-22}$ A/μm) or smaller. Hence, the off-state current can be 1 aA/μm ($1\times10^{-18}$ A/μm) or smaller, 100 zA/μm ($1\times10^{-19}$ A/μm) or smaller, and 1 zA/μm ($1\times10^{-21}$ A/μm) or smaller at 125° C., 85° C., and room temperature, respectively.

Note that in order to prevent hydrogen and moisture from being included in the oxide semiconductor film during formation thereof, it is preferable to increase the purity of a sputtering gas by sufficiently suppressing leakage from the outside of a treatment chamber and degasification through an inner wall of the treatment chamber. For example, a gas with a dew point of −70° C. or lower is preferably used as the sputtering gas in order to prevent moisture from being included in the film. In addition, it is preferable to use a target which is highly purified so as not to include impurities such as hydrogen and moisture. Although it is possible to remove moisture from a film of an oxide semiconductor containing In, Sn, and Zn as main components by heat treatment, a film which does not include moisture originally is preferably formed because moisture is released from the oxide semiconductor containing In, Sn, and Zn as main components at a higher temperature than from an oxide semiconductor containing In, Ga, and Zn as main components.

The relation between the substrate temperature and electrical characteristics of a transistor of the sample, on which heat treatment at 650° C. was performed after formation of the oxide semiconductor film, was evaluated.

The transistor used for the measurement has a channel length L of 3 μm, a channel width W of 10 μm, Lov of 3 μm on one side (total Lov of 6 μm), and dW of 0 μm. Note that $V_d$ was set to 10 V. Note that the substrate temperature was −40° C., −25° C., 25° C., 75° C., 125° C., and 150° C. Here, in the transistor, the width of a portion where a gate electrode overlaps with one of a pair of electrodes is referred to as Lov, and the width of a portion of the pair of electrodes, which does not overlap with an oxide semiconductor film, is referred to as dW.

Figure 21:
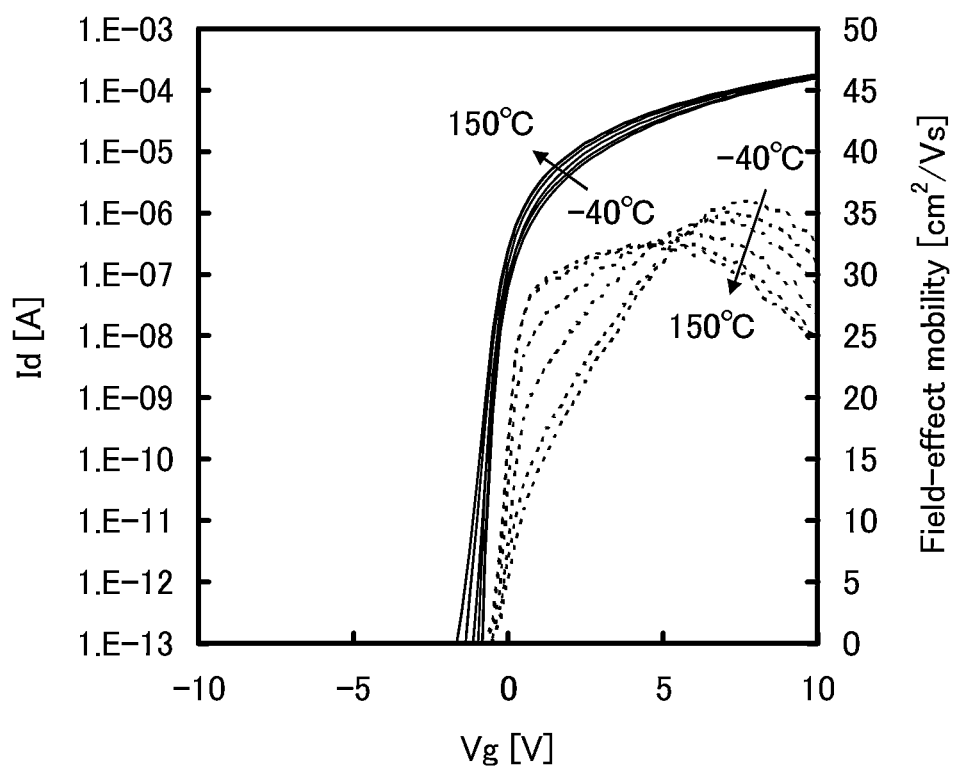
FIG. 21 shows $V_g$ dependence of $I_d$ and field-effect mobility.
Figure 22A:
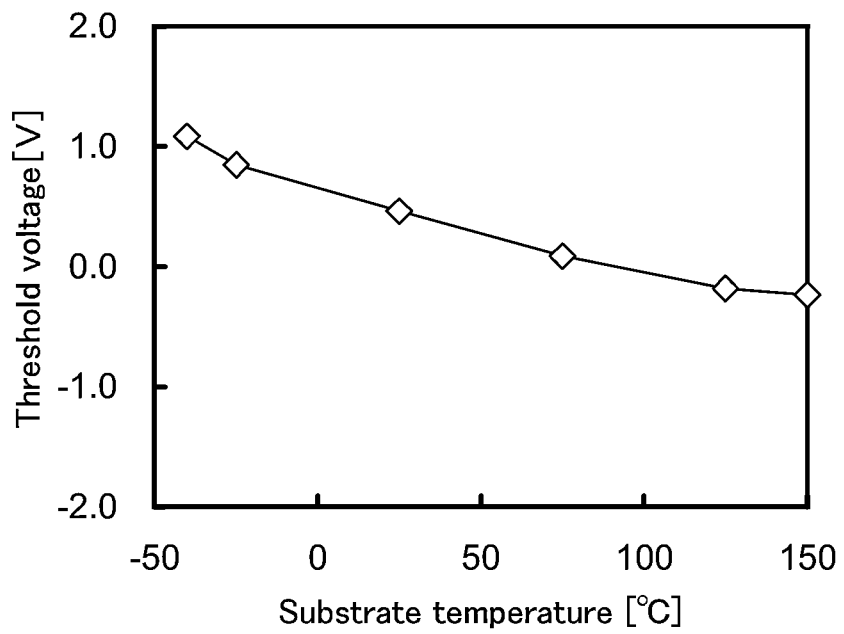
FIG. 22A shows a relation between substrate temperature and threshold voltage.

FIG. 21 shows the $V_g$ dependence of $I_d$ (a solid line) and field-effect mobility (a dotted line). FIG. 22A shows a relation between the substrate temperature and the threshold voltage, and FIG. 22B shows a relation between the substrate temperature and the field-effect mobility.

From FIG. 22A, it is found that the threshold voltage gets lower as the substrate temperature increases. Note that the threshold voltage is decreased from 1.09 V to −0.23 V in the range from −40° C. to 150° C.

Figure 22B:
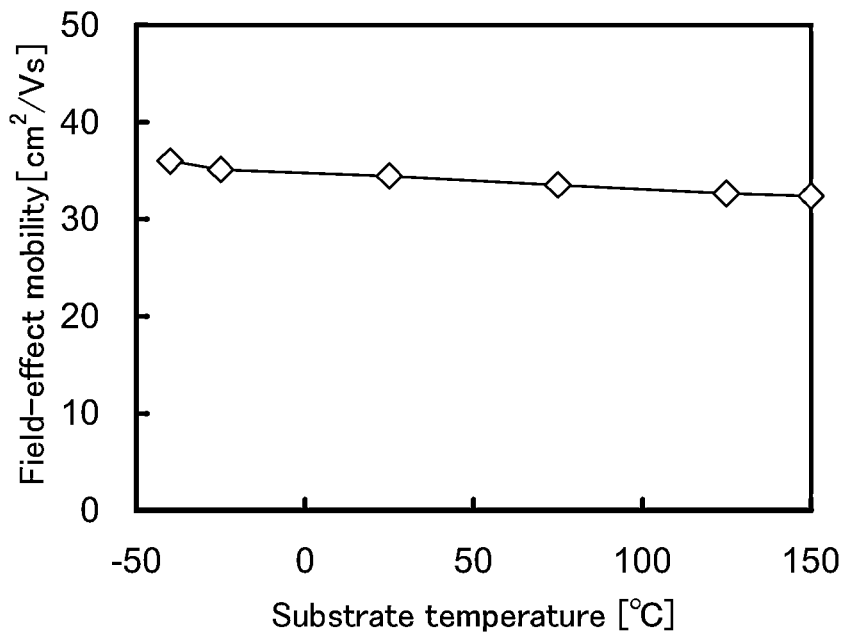
FIG. 22B shows a relation between substrate temperature and field-effect mobility.

From FIG. 22B, it is found that the field-effect mobility gets lower as the substrate temperature increases. Note that the field-effect mobility is decreased from 36 cm$^2$/Vs to 32 cm$^2$/Vs in the range from −40° C. to 150° C. Thus, it is found that variation in electrical characteristics is small in the above temperature range.

In a transistor in which such an oxide semiconductor containing In, Sn, and Zn as main components is used as a channel formation region, a field-effect mobility of 30 cm$^2$/Vs or higher, preferably 40 cm$^2$/Vs or higher, further preferably 60 cm$^2$/Vs or higher can be obtained with the off-state current maintained at 1 aA/μm or smaller, which can achieve on-state current needed for an LSI. For example, in an FET where L/W is 33 nm/40 nm, an on-state current of 12 μA or larger can flow when the gate voltage is 2.7 V and the drain voltage is 1.0 V.

Thus, a transistor having extremely small off-state current is used for the transistor for switching the logic circuit described in the above embodiments, whereby a charge holding state at the node N can be held even when a power supply potential is not supplied. Thus, writing of data to the node N after the power is supplied can be omitted, so that start-up time of a logic block can be short. Accordingly, a programmable logic device in which power consumption is reduced by a normally-off driving method can be provided.

Further, when the transistor having high mobility is used as the transistor for switching the logic circuit described in the above embodiments, writing of data to the node N can be performed at high speed; therefore, a programmable logic device in which dynamic configuration can be performed easily can be provided.

With such characteristics, a programmable logic device can be provided without decreasing the operation speed even when a transistor including an oxide semiconductor is also provided in an integrated circuit formed using a Si semiconductor.

Embodiment 5

With the use of a logic circuit according to an embodiment of the present invention, a low power consumption electronic device can be provided. In particular, in the case of a portable electronic device which has difficulty in continuously receiving power, an advantage in increasing the continuous operating time can be obtained when a low power consumption semiconductor device according to an embodiment of the present invention is added as a component of the device.

The semiconductor device including a logic circuit according to an embodiment of the present invention can be used for display devices, personal computers, or image reproducing devices provided with recording media (typically, devices which reproduce the content of recording media such as digital versatile discs (DVDs) and have displays for displaying the reproduced images). Other than the above, as an electronic device which can use the semiconductor device according to an embodiment of the present invention, mobile phones, game machines including portable game machines, portable information terminals, electronic books, video cameras, digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given.

The case is described in which the semiconductor device including a logic circuit according to an embodiment of the present invention is applied to a portable electronic device such as a mobile phone, a smartphone, or an electronic book.

Figure 8:
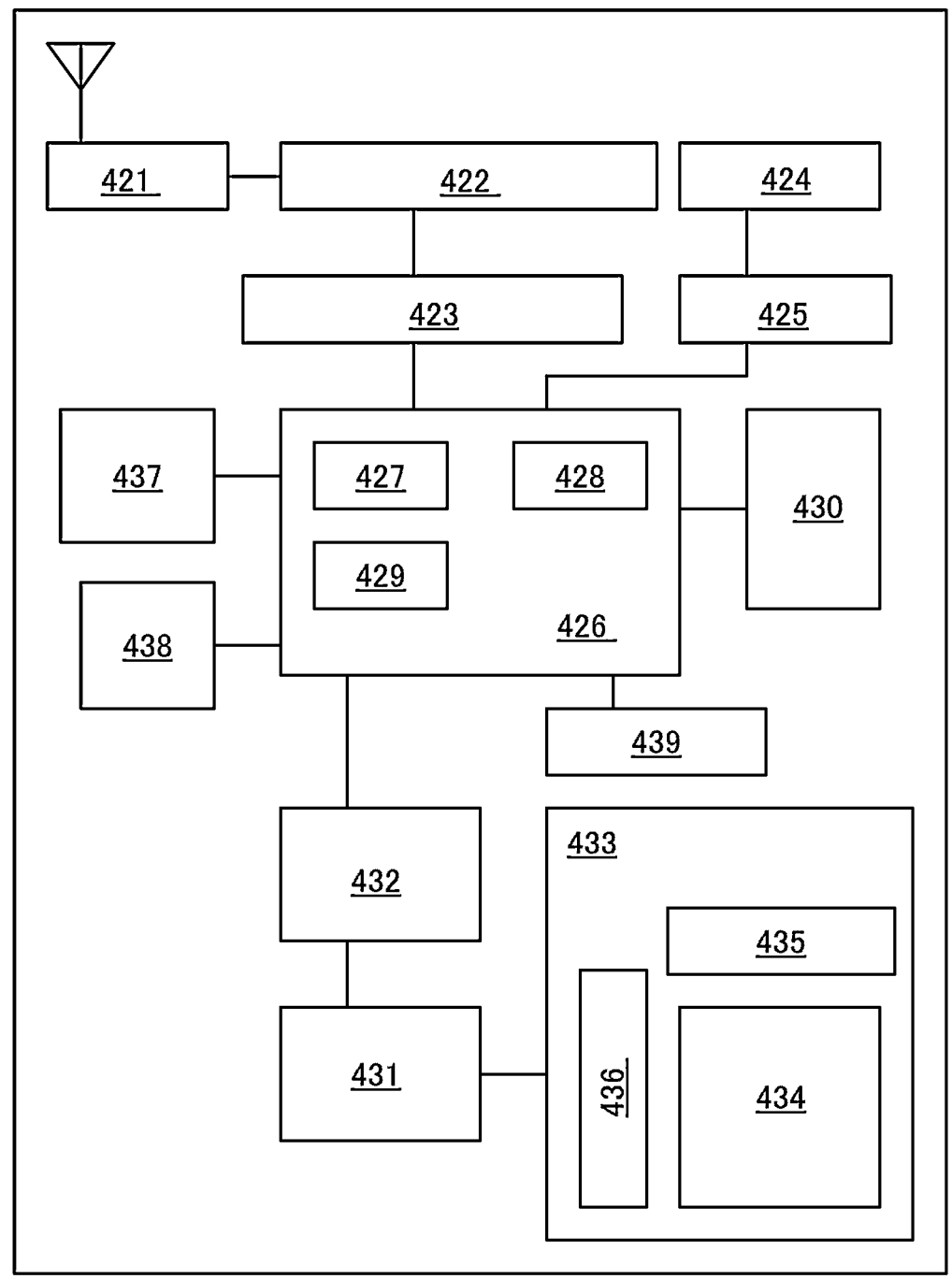
FIG. 8 is a block diagram of a portable electronic device.

FIG. 8 is a block diagram of a portable electronic device. The portable electronic device illustrated in FIG. 8 includes an RF circuit 421, an analog baseband circuit 422, a digital baseband circuit 423, a battery 424, a power supply circuit 425, an application processor 426, a flash memory 430, a display controller 431, a memory circuit 432, a display 433, a touch sensor 439, an audio circuit 437, a keyboard 438, and the like. The display 433 includes a display portion 434, a source driver 435, and a gate driver 436. The application processor 426 includes a CPU 427, a DSP 428, and an interface 429. For example, when the programmable logic device in the above embodiment is used as any of or all of the CPU 427, the digital baseband circuit 423, the memory circuit 432, the DSP 428, the interface 429, the display controller 431, and the audio circuit 437, power consumption can be reduced.

Figure 9:
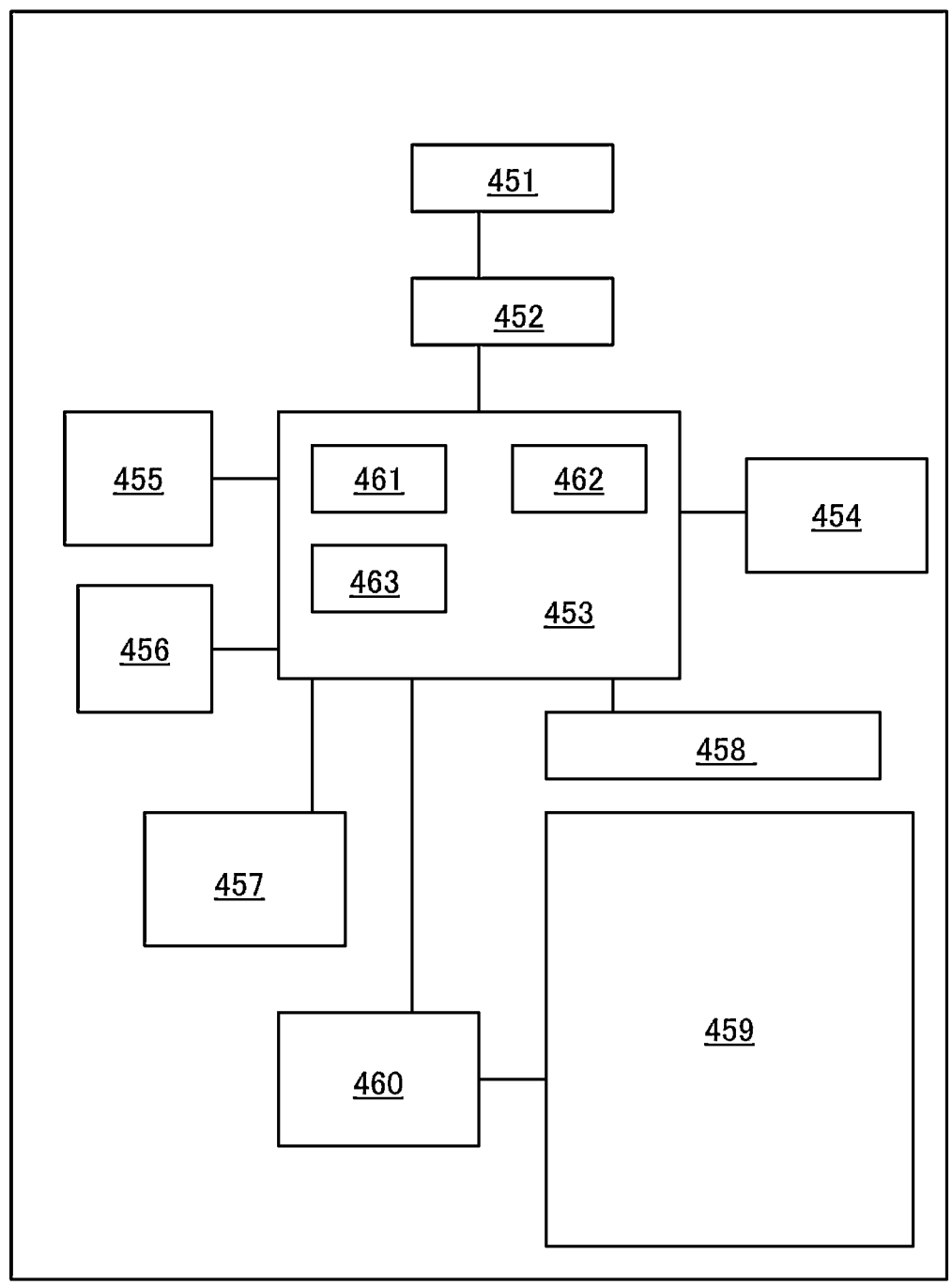
FIG. 9 is a block diagram of an electronic book.

FIG. 9 is a block diagram of an electronic book. The electronic book includes a battery 451, a power supply circuit 452, a microprocessor 453, a flash memory 454, an audio circuit 455, a keyboard 456, a memory circuit 457, a touch panel 458, a display 459, and a display controller 460. The microprocessor 453 includes a CPU 461, a DSP 462, and an interface 463. For example, when the programmable logic device in the above embodiment is used as any of or all of the CPU 461, the audio circuit 455, the memory circuit 457, the display controller 460, the DSP 462, and the interface 463, power consumption can be reduced.

This embodiment can be combined with any of the above embodiments as appropriate.

The configurations, methods, and the like described in this embodiment can be combined as appropriate with any of the configurations, methods, and the like described in the other embodiments.

This application is based on Japanese Patent Application serial no. 2011-112804 filed with Japan Patent Office on May 19, 2011, the entire contents of which are hereby incorporated by reference.

What is claimed is:

1. A logic circuit comprising:
first to fourth transistors;
fifth to eighth transistors;
a ninth transistor and a tenth transistor with gates electrically connected to each other; and
an eleventh transistor with one of a source and a drain electrically connected to the gates of the ninth transistor and the tenth transistor,
wherein one of a source and a drain of the first transistor is electrically connected to one of a source and a drain of the fifth transistor,
wherein one of a source and a drain of the fourth transistor is electrically connected to one of a source and a drain of the eighth transistor,
wherein a gate of the first transistor, a gate of the third transistor, and a gate of the eighth transistor are electrically connected to each other,
wherein a gate of the second transistor, a gate of the fourth transistor, and a gate of the fifth transistor are electrically connected to each other,
wherein a gate of the sixth transistor, a gate of the seventh transistor, the gate of the ninth transistor, and the gate of the tenth transistor are electrically connected to the one of the source and the drain of the eleventh transistor, where a node is formed,
wherein one of a source and a drain of the ninth transistor is electrically connected to the other of the source and the drain of the first transistor and one of a source and a drain of the second transistor,
wherein the other of the source and the drain of the ninth transistor is electrically connected to the other of the source and the drain of the fifth transistor and one of a source and a drain of the sixth transistor,
wherein one of a source and a drain of the tenth transistor is electrically connected to one of a source and a drain of the third transistor and the other of the source and the drain of the fourth transistor, wherein the other of the source and the drain of the tenth transistor is electrically connected to one of a source and a drain of the seventh transistor and the other of the source and the drain of the eighth transistor, wherein the other of the source and the drain of the second transistor, the other of the source and the drain of the third transistor, the other of the source and the drain of the sixth transistor, and the other of the source and the drain of the seventh transistor are electrically connected to each other, and wherein the eleventh transistor includes an oxide semiconductor.

2. The logic circuit according to claim 1, further comprising a capacitor electrically connected to the node.

3. The logic circuit according to claim 1, wherein switching to a NOR circuit or a NAND circuit is performed by switching a charge holding state at the node.

4. The logic circuit according to claim 1,
wherein the first transistor, the second transistor, the fifth transistor, the sixth transistor, and the ninth transistor are p-channel transistors, and
wherein the third transistor, the fourth transistor, the seventh transistor, the eighth transistor, the tenth transistor, and the eleventh transistor are n-channel transistors.

5. The logic circuit according to claim 1, wherein the oxide semiconductor includes at least one element selected from In, Ga, Sn, and Zn.

6. A logic circuit comprising:
first to fourth transistors;
fifth to eighth transistors;
a ninth transistor and a tenth transistor with gates electrically connected to each other; and
an eleventh transistor with one of a source and a drain electrically connected to the gates of the ninth transistor and the tenth transistor,
wherein one of a source and a drain of the first transistor is electrically connected to one of a source and a drain of the fifth transistor,
wherein one of a source and a drain of the fourth transistor is electrically connected to one of a source and a drain of the eighth transistor,
wherein a gate of the first transistor, a gate of the third transistor, and a gate of the eighth transistor are electrically connected to each other.
wherein a gate of the second transistor, a gate of the fourth transistor, and a gate of the fifth transistor are electrically connected to each other,
wherein a gate of the sixth transistor, a gate of the seventh transistor, the gate of the ninth transistor, and the gate of the tenth transistor are electrically connected to the one of the source and the drain of the eleventh transistor, where a node is formed,
wherein one of a source and a drain of the ninth transistor is electrically connected to the other of the source and the drain of the first transistor and one of a source and a drain of the second transistor,
wherein the other of the source and the drain of the ninth transistor is electrically connected to the other of the source and the drain of the fifth transistor and one of a source and a drain of the sixth transistor,
wherein one of a source and a drain of the tenth transistor is electrically connected to one of a source and a drain of the third transistor and the other of the source and the drain of the fourth transistor, wherein the other of the source and the drain of the tenth transistor is electrically connected to one of a source and a drain of the seventh transistor and the other of the source and the drain of the eighth transistor, wherein the other of the source and the drain of the second transistor, the other of the source and the drain of the third transistor, the other of the source and the drain of the sixth transistor, and the other of the source and the drain of the seventh transistor are electrically connected to each other, wherein the eleventh transistor includes an oxide semiconductor, and wherein the eleventh transistor is stacked over the first to tenth transistors.

7. The logic circuit according to claim 6, further comprising a capacitor electrically connected to the node.

8. The logic circuit according to claim 6, wherein switching to a NOR circuit or a NAND circuit is performed by switching a charge holding state at the node.

9. The logic circuit according to claim 6,
wherein the first transistor, the second transistor, the fifth transistor, the sixth transistor, and the ninth transistor are p-channel transistors, and
wherein the third transistor, the fourth transistor, the seventh transistor, the eighth transistor, the tenth transistor, and the eleventh transistor are n-channel transistors.

10. The logic circuit according to claim 6, wherein the oxide semiconductor includes at least one element selected from In, Ga, Sn, and Zn.

11. A logic circuit comprising:
first to fourth transistors;
fifth to eighth transistors;
a ninth transistor and a tenth transistor with gates electrically connected to each other; and
an eleventh transistor with one of a source and a drain electrically connected to the gates of the ninth transistor and the tenth transistor,
wherein one of a source and a drain of the first transistor and one of a source and a drain of the fifth transistor are electrically connected to a high potential power supply line,
wherein one of a source and a drain of the fourth transistor and one of a source and a drain of the eighth transistor are grounded or electrically connected to a low potential power supply line,
wherein a gate of the first transistor, a gate of the third transistor, and a gate of the eighth transistor are electrically connected to a first signal line.
wherein a gate of the second transistor, a gate of the fourth transistor, and a gate of the fifth transistor are electrically connected to a second signal line,
wherein a gate of the sixth transistor, a gate of the seventh transistor, the gate of the ninth transistor, and the gate of the tenth transistor are electrically connected to the one of the source and the drain of the eleventh transistor, where a node is formed,
wherein the other of the source and the drain of the eleventh transistor is electrically connected to a third signal line,
wherein a gate of the eleventh transistor is electrically connected to a fifth signal line,
wherein one of a source and a drain of the ninth transistor is electrically connected to the other of the source and the drain of the first transistor and one of a source and a drain of the second transistor,
wherein the other of the source and the drain of the ninth transistor is electrically connected to the other of the source and the drain of the fifth transistor and one of a source and a drain of the sixth transistor, wherein one of a source and a drain of the tenth transistor is electrically connected to one of a source and a drain of the third transistor and the other of the source and the drain of the fourth transistor, wherein the other of the source and the drain of the tenth transistor is electrically connected to one of a source and a drain of the seventh transistor and the other of the source and the drain of the eighth transistor, wherein the other of the source and the drain of the second transistor, the other of the source and the drain of the third transistor, the other of the source and the drain of the sixth transistor, and the other of the source and the drain of the seventh transistor are electrically connected to a fourth signal line, and wherein the eleventh transistor includes an oxide semiconductor.

12. The logic circuit according to claim 11, further comprising a capacitor electrically connected to the node.

13. The logic circuit according to claim 11, wherein switching to a NOR circuit or a NAND circuit is performed by switching a charge holding state at the node.

14. The logic circuit according to claim 11, wherein the first transistor, the second transistor, the fifth transistor, the sixth transistor, and the ninth transistor are p-channel transistors, and wherein the third transistor, the fourth transistor, the seventh transistor, the eighth transistor, the tenth transistor, and the eleventh transistor are n-channel transistors.

15. The logic circuit according to claim 11, wherein the oxide semiconductor includes at least one element selected from In, Ga, Sn, and Zn.

* * * * *